US007845070B2

(12) United States Patent
Ohashi

(10) Patent No.: US 7,845,070 B2
(45) Date of Patent: Dec. 7, 2010

(54) MANUFACTURING METHOD OF INK JET HEAD

(75) Inventor: Yumiko Ohashi, Hashima (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 418 days.

(21) Appl. No.: 11/644,247

(22) Filed: Dec. 22, 2006

(65) Prior Publication Data

US 2007/0144001 A1 Jun. 28, 2007

(30) Foreign Application Priority Data

Dec. 27, 2005 (JP) ............................ 2005-373967

(51) Int. Cl.
*H05K 3/36* (2006.01)
*B23P 17/00* (2006.01)
*B21D 53/76* (2006.01)

(52) U.S. Cl. ....................................... 29/830; 29/890.1

(58) Field of Classification Search ................ 29/890.1, 29/830; 347/40, 44
See application file for complete search history.

(56) References Cited

U.S. PATENT DOCUMENTS 5,269,873 A * 12/1993 Platzer et al. ............... 156/584
5,282,918 A * 2/1994 Heist et al. .................. 156/344
6,780,340 B2 * 8/2004 Conta .......................... 216/27
6,942,815 B2 * 9/2005 Umehara ...................... 216/27
7,140,083 B2 * 11/2006 Ito ............................ 29/25.35
7,188,419 B2 * 3/2007 Silverbrook ............... 29/890.1
7,381,341 B2 * 6/2008 Shimada et al. ............... 216/27
2005/0011071 A1 * 1/2005 Kanada et al. ............. 29/890.1

FOREIGN PATENT DOCUMENTS

JP 2001-10071 1/2001
JP 2001-010071 * 1/2001
JP 2001010071 * 1/2001

* cited by examiner

*Primary Examiner*—A. Dexter Tugbang
*Assistant Examiner*—David P Angwin
(74) *Attorney, Agent, or Firm*—Frommer Lawrence & Haug LLP

(57) ABSTRACT

A manufacturing method of an ink jet head has: a step of forming a flow path hole on each of first plates to be flow path plates; a step of laminating one or plurality of said flow path plates on which said flow path hole is formed and a second plate to be a nozzle plate to each other; a step of laminating a protective film to said second plate; a step of laminating said plurality of flow path plates on which said flow path holes are formed to each other; a step of forming a nozzle hole on a region where the protective film is laminated, in said second plate to which the protective film is laminated; and a step of removing said protective film from said nozzle plate, after the step of laminating said plurality of flow path plates and said nozzle plate to each other.

14 Claims, 19 Drawing Sheets

MANUFACTURING METHOD OF INK JET HEAD

CROSS-REFERENCE TO RELATED APPLICATIONS

This Nonprovisional application claims priority under 35 U.S.C. §119(a) on patent application Ser. No. 2005-373967 filed in Japan on Dec. 27, 2005, the entire contents of which are hereby incorporated by reference.

BACKGROUND

The present invention relates to a manufacturing method of an ink jet head for discharging an ink.

In an ink jet head having a discharging port for discharging an ink, there is a case that a flow path unit where an ink flow path for supplying the ink to the discharging port is formed, is constituted by a plurality of plates. In this case, the flow path unit is produced, for example, by laminating the plurality of plates so that flow path holes and nozzle holes, which constitute the ink flow path, are formed in each plate, and those flow path holes and nozzle holes are then linked to constitute the ink flow path. Then, in a manufacturing step of the flow path unit as mentioned above, there is a case that the nozzle holes are formed while a protective film is still laminated onto the plate, in order to protect the nozzle holes from residue and scar, which are generated when the nozzle holes are formed on the plate, as described in Japanese Patent Application Laid Open No. 2001-10071.

SUMMARY

However, in Japanese Patent Application Laid Open No. 2001-10071, the protective film is laminated onto the adhesive surface to the other plate in the plate on which the nozzle holes are formed, through an adhesive sheet to laminate the plates to each other. For this reason, before the respective plates are laminated, the protective film is required to be removed. Thus, in order to protect the nozzle holes in the later steps, a work for again laminating the protective film is required, which results in the increase in excessive steps.

It is therefore an object to provide a manufacturing method of an ink jet head where even at a step after a nozzle is formed, a protective film protects the nozzle, and excessive steps are not required.

The manufacturing method of the ink jet head according to a first aspect is characterized by a manufacturing method of an ink jet head that has: a plurality of laminated flow path plates in which a flow path hole is formed in each of them; and a nozzle plate laminated on said flow path plate located at the outermost position, wherein a nozzle hole which is linked to said flow path hole and discharges an ink supplied from said flow path hole is formed in said nozzle plate, comprising: a flow path hole forming step of forming a flow path hole on each of first plates to be said flow path plates; a first laminating step of laminating one or plurality of said flow path plates on which said flow path hole is formed at said flow path hole forming step and a second plate to be said nozzle plate to each other; a second laminating step of laminating a protective film to said second plate; a third laminating step of laminating said plurality of flow path plates on which said flow path holes are formed at said flow path hole forming step to each other; a nozzle hole forming step of forming said nozzle hole on a region where the protective film is laminated, in said second plate to which the protective film is laminated at said second laminating step; and a film removing step of removing said protective film from said nozzle plate, after the step of laminating said plurality of flow path plates and said nozzle plate to each other.

According to the first aspect, the nozzle hole is formed in the region where the protective film is laminated. Thus, when the nozzle plate and the different plate are laminated to each other, the protective film is not required to be removed from the nozzle plate. Then, the protective film laminated prior to the formation of the nozzle hole is still laminated not only during the nozzle hole forming step but also after the subsequent steps. For this reason, at the respective steps, it is suppressed that the dust is deposited on the nozzle hole and that the nozzle hole and its periphery are damaged. Also, the number of the steps required to manufacture the ink jet head is reduced as compared with the case that the protective film is laminated or removed at each step.

The above and further objects and features will more fully be apparent from the following detailed description with accompanying drawings.

DETAILED DESCRIPTION OF THE EXEMPLARY EMBODIMENTS

A preferred embodiment will be described below with reference to the drawings.

<Printer Schema>

Figure 1:
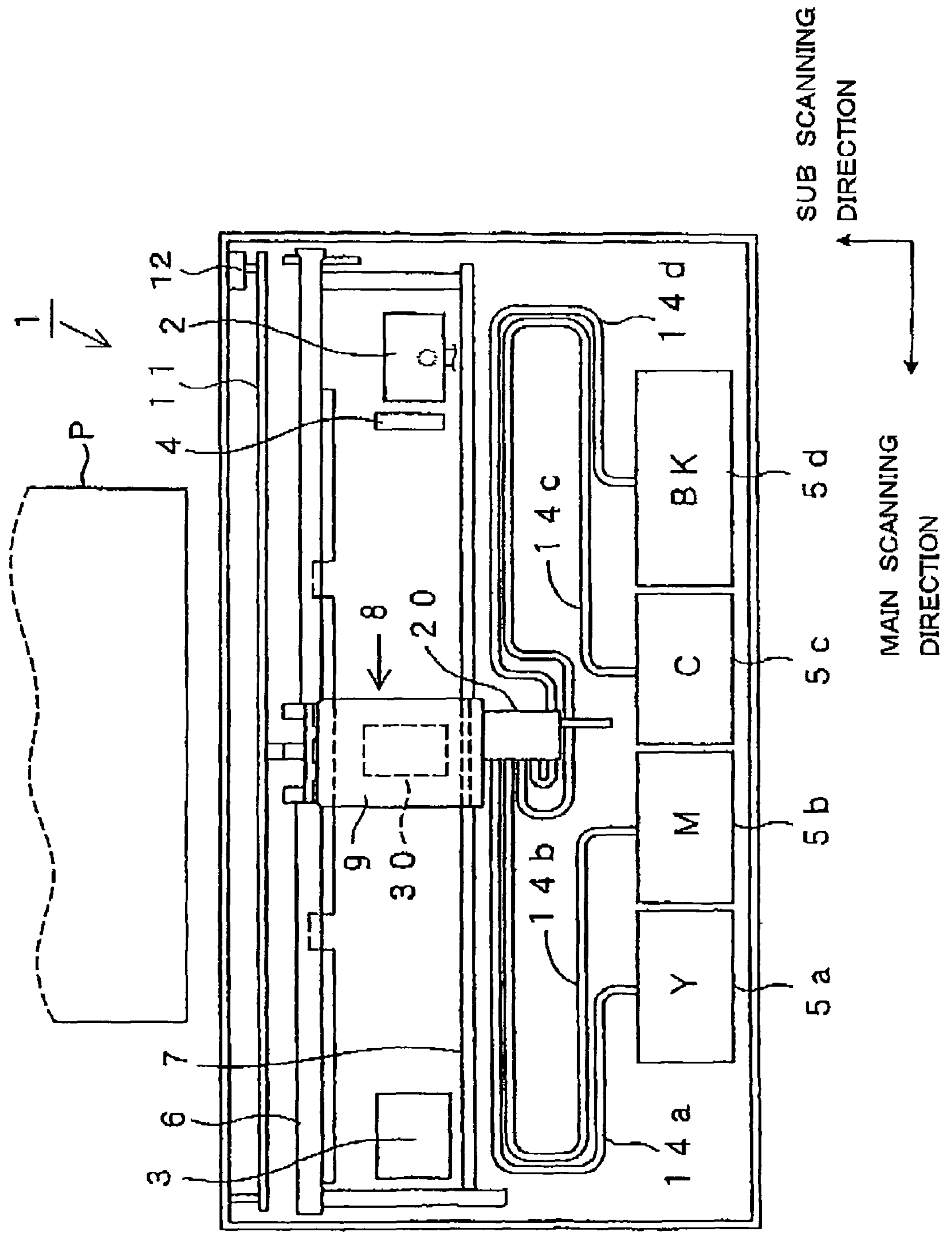
FIG. 1 is a schematic top view showing one example of an ink jet printer to which a manufacturing method of an ink jet head in this embodiment is applied.

FIG. 1 is a view showing an ink jet printer 1 where an ink jet head according to a manufacturing method that is one example in this embodiment is installed. Hereafter, this is abbreviated as the printer 1. FIG. 1 shows the inside of the printer 1 viewed from the top surface.

Two guide shafts 6, 7 are placed inside the printer 1. A head unit 8 serving as a carriage is placed in those guide shafts 6, 7 along a main scanning direction so as to reciprocate. The head unit 8 has a head holder 9 made of synthetic resin. The head holder 9 holds an ink jet head 30 that has a plurality of nozzles and discharges inks from the nozzles and performs the printing on a print paper P which is fed towards the lower portion of the head unit 8.

A carriage motor 12 is placed in the printer 1. An endless belt 11 driven by the drive of the carriage motor 12 is wound around a drive shaft of the carriage motor 12. The head holder 9 is attached to the endless belt 11. When the endless belt 11 is rotated, the head holder 9 is reciprocated along the main scanning direction.

The printer 1 has ink cartridges 5*a*, 5*b*, 5*c* and 5*d*. A yellow ink (Y), a magenta ink (M), a cyan ink (C) and a black ink (BK) are accommodated in those ink cartridges 5*a* to 5*d*, respectively. The respective ink cartridges 5*a* to 5*d* are connected through flexible tubes 14*a*, 14*b*, 14*c* and 14*d* to a tube joint 20 placed in the head unit 8. The inks inside the ink cartridges 5*a* to 5*d* are supplied through the tube joint 20 to the head unit 8.

The printer 1 has an ink absorption member 3 placed on one end, for the main scanning direction defined by the guide shafts 6, 7. The ink absorption member 3 is located just below the head unit 8, when the head unit 8 is moved to the end on the guide shafts 6, 7. The ink absorption member 3 absorbs the ink discharged from the nozzles of the head unit 8 (the ink jet head 30) at a time of a flushing operation. Also, the printer 1 has a purging device 2 placed at the other end of the ink absorption member 3 between the guide shafts 6, 7. The purging device 2 absorbs the ink from the nozzles at a time of a purging operation.

In the printer 1, a wiper 4 is placed at a position adjacent to the purging device 2 in the main scanning direction, between the guide shafts 6, 7. The wiper 4 wipes the ink deposited on the nozzle surface on which the nozzles are formed.

<Head Unit>

Figure 2:
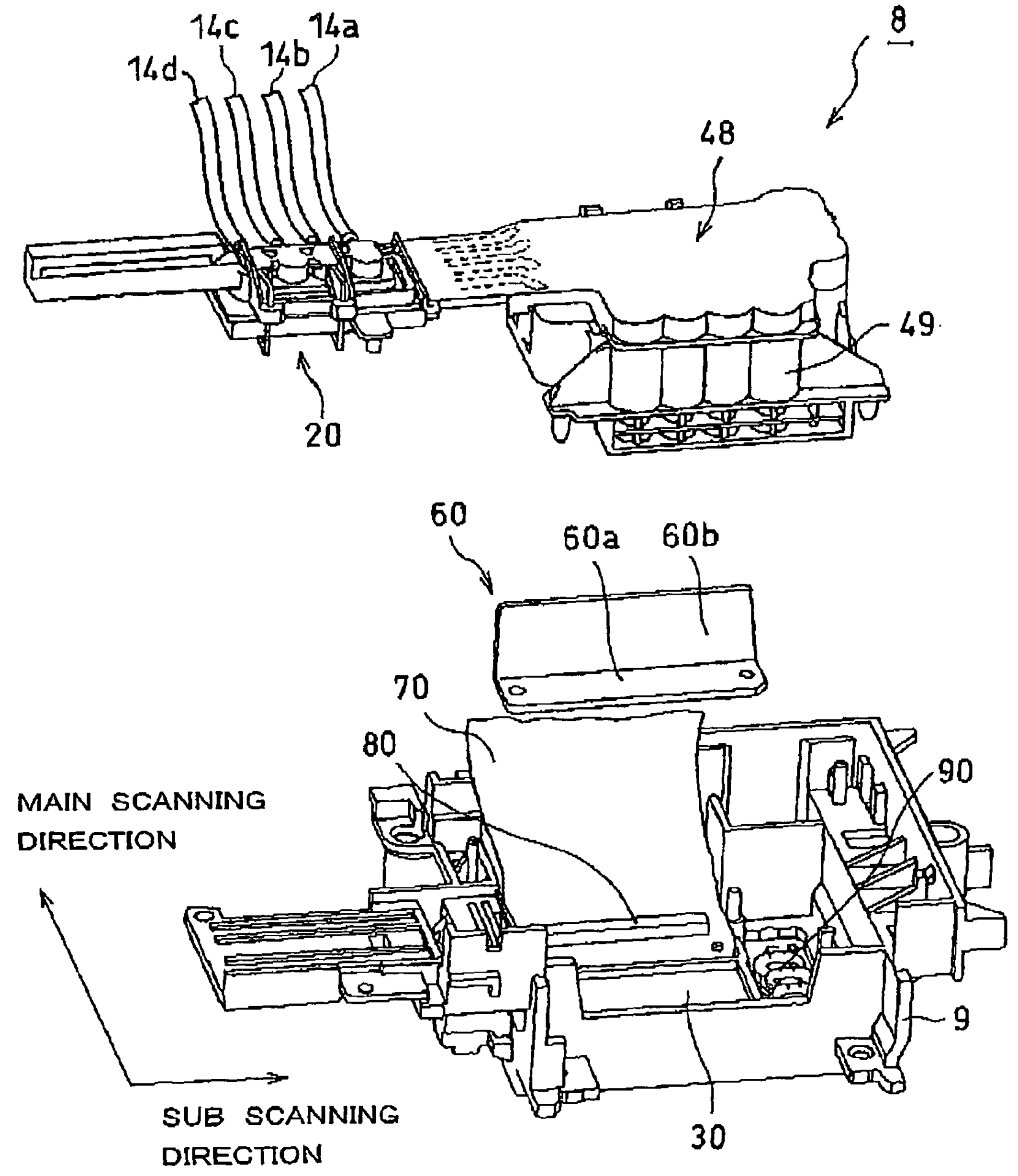
FIG. 2 is an exploded perspective view of a head unit shown in FIG. 1.

The head unit 8 will be described below. FIG. 2 shows a situation that a buffer tank 48 and a heat sink 60 are removed from the head holder 9, in the head unit 8.

The head holder 9 is formed in the shape of a box where it is opened towards the side that receives the buffer tank 48. The ink jet head 30 is placed on the bottom of the head holder 9. The buffer tank 48 is accommodated in the head holder 9 so that it is located above the ink jet head 30.

A tube joint 20 is connected to one end on the top surface of the buffer tank 48. As mentioned above, the tube joint 20 is connected through the tubes 14*a* to 14*d* to the ink cartridges 5*a* to 5*d*. The inks are supplied from the ink cartridges 5*a* to 5*d* through the tubes 14*a* to 14*d* to the buffer tank 48. Four ink flow outlets (not shown) are placed on the bottom surface of the buffer tank 48. Those ink flow outlets are connected through a sealing member 90 to four ink supply ports 91*a*, 91*b*, 91*c* and 91*d* placed on the ink jet head 30, which will be described later.

The head holder 9 has the heat sink 60. The heat sink 60 has a horizontal portion 60*a* extending along a sub scanning direction and a vertical portion 60*b* that rises up from one end of the horizontal portion 60*a*. The horizontal portion 60*a* and the vertical portion 60*b* are both formed in the shape of a long plate in the sub scanning direction, as shown in FIG. 2.

From the head holder 9, an FPC (Flexible Printed Circuit) 70 which will be described later is upwardly pulled through the gap formed in the bottom of the head holder 9. One end of the FPC 70 is connected to a head body 25 placed in the ink jet head 30, which will be described later. The other end is electrically connected to a controller of the printer 1 (not shown). The controller of the printer 1 controls the ink discharged from the head body 25, in accordance with an image data, through the FPC 70. A driver IC 80 is placed in the middle between the one end connected to the head body 25 in the FPC 70 and the other end connected to the controller.

Figure 3:
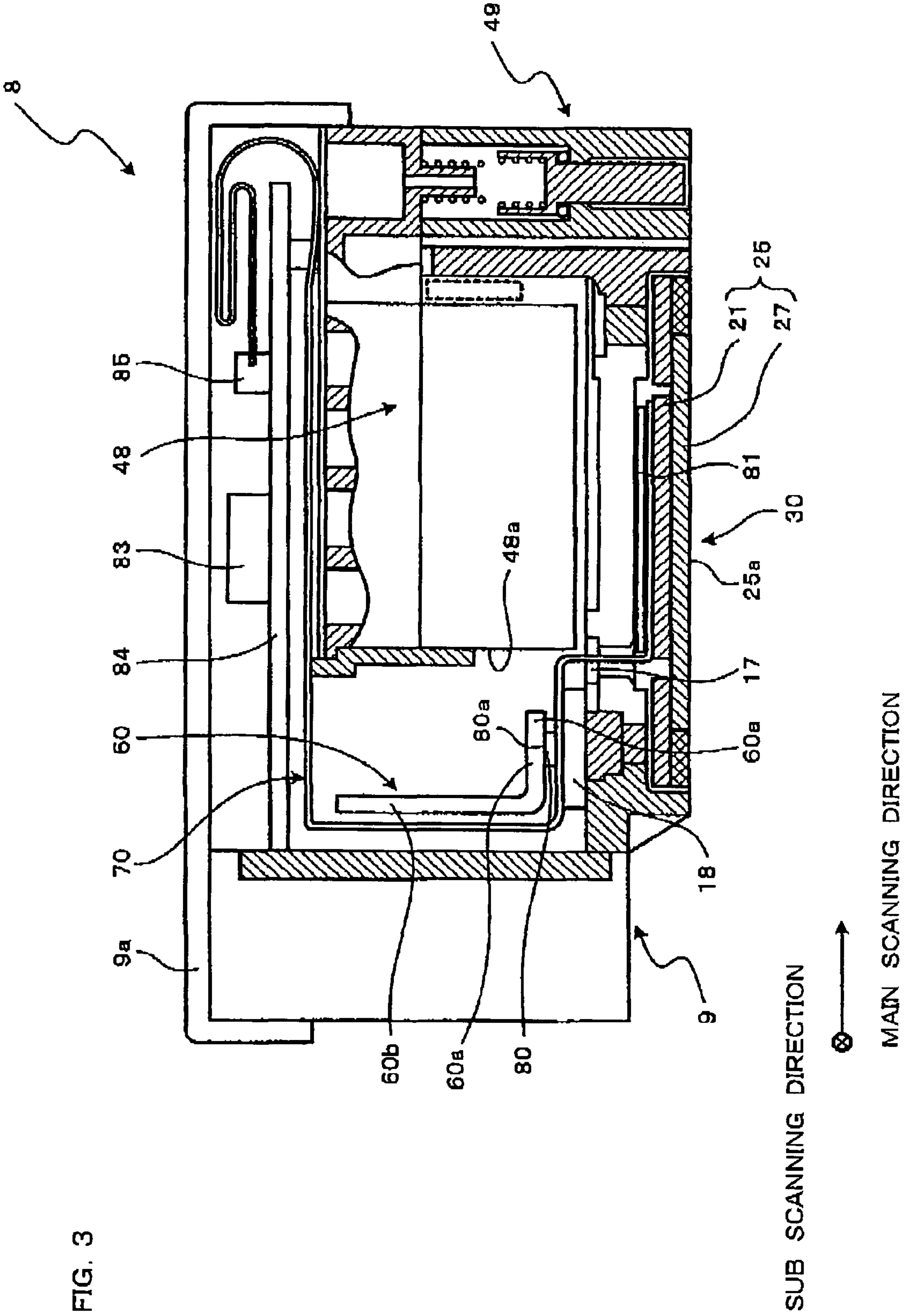
FIG. 3 is a longitudinal sectional view of the head unit shown in FIG. 1.

The FIG. 3 is a longitudinal sectional view of the head unit 8 that is cut along the main scanning direction. FIG. 3 shows the situation that the buffer tank 48 and the heat sink 60 are accommodated in the head holder 9.

The heat sink 60 is fixed at the position adjacent to a side wall 48*a* on a return direction side (on the left side of FIG. 3) in the main scanning direction of the buffer tank 48. One surface in the vertical portion 60*b* of the heat sink 60 is opposite to the side wall 48*a*. Also, the horizontal portion 60*a* of the heat sink 60 is arranged on the bottom side of the head holder 9, with its short side direction being along the main scanning direction.

A control board 84 on which electronic parts such as a condenser 83 and a connector 85 are mounted, is placed above the buffer tank 48. The upper portion of the control board 84 is covered by a cover 9*a* serving as a top surface cover of the head holder 9.

An exhauster 49 for exhausting air accumulated in the buffer tank 48 to outside is placed on the side of the main scanning direction (the right side of FIG. 3) of the buffer tank 48.

The ink jet head 30 placed in the bottom of the head holder 9 has the head body 25. The head body 25 is fixed to the bottom of the head holder 9, which will be described later. A nozzle surface 25*a* on which a plurality of nozzles are formed, is formed on the head body 25 so that it is exposed to the outside below the head holder 9. The head body 25 has a piezoelectric actuator 21 and a flow path unit 27, which will be described later.

The one end in the FPC 70 is electrically connected to the piezoelectric actuator 21. The other end in the FPC 70 is pulled out to the connector 85 placed above the buffer tank 48, through the following route and electrically connected to the connector 85. At first, the FPC 70 is upwardly pulled through a hole 17 formed in the bottom of the head holder 9. Next, the pulled FPC 70 is upwardly oriented through the gap formed between the heat sink 60 and the inner wall of the head holder 9. From it, the FPC 70 is extended upwardly along one inner side in the head holder 9 and bent near the control board 84 and further extended in the main scanning direction along the lower surface of the control board 84. Then, the FPC 70 is bent upwardly near the other inner side in the head holder 9 and passed through the gap formed between the end of the control board 84 and the other inner side and then pulled out to the side where the connector 85 on the top surface of the control board 84 is formed. It is noted that the connector 85 is electrically connected to the controller of the printer 1 through a route (not shown).

Also, the driver IC 80 is placed in the FPC 70, as mentioned above. The driver IC 80 is placed on the surface of the FPC 70 opposite to the horizontal portion 60*a* of the heat sink 60 and located below the heat sink 60. Moreover, an elastic member 18 is placed below the driver IC 80. The FPC 70 is pushed such that the elastic member 18 causes the top surface of the driver IC 80 to be brought into contact with the horizontal portion 60*a* of the heat sink 60. Consequently, the excessive heat of the heated driver IC 80 is thermally dispersed by the heat sink 60.

Moreover, a heat conductor 81 is placed in the region opposite to the piezoelectric actuator 21 in the FPC 70. The heat conductor 81 is an aluminum plate which has the rectangular flat shape of the size substantially equal to the top surface of the piezoelectric actuator 21 and has a uniform thickness. Consequently, the heat generated from the piezoelectric actuator 21 and the portion opposite to the piezoelectric actuator 21 in the FPC 70 is thermally dispersed by the heat conductor 81.

<Head Body and the Like>

Figure 4:
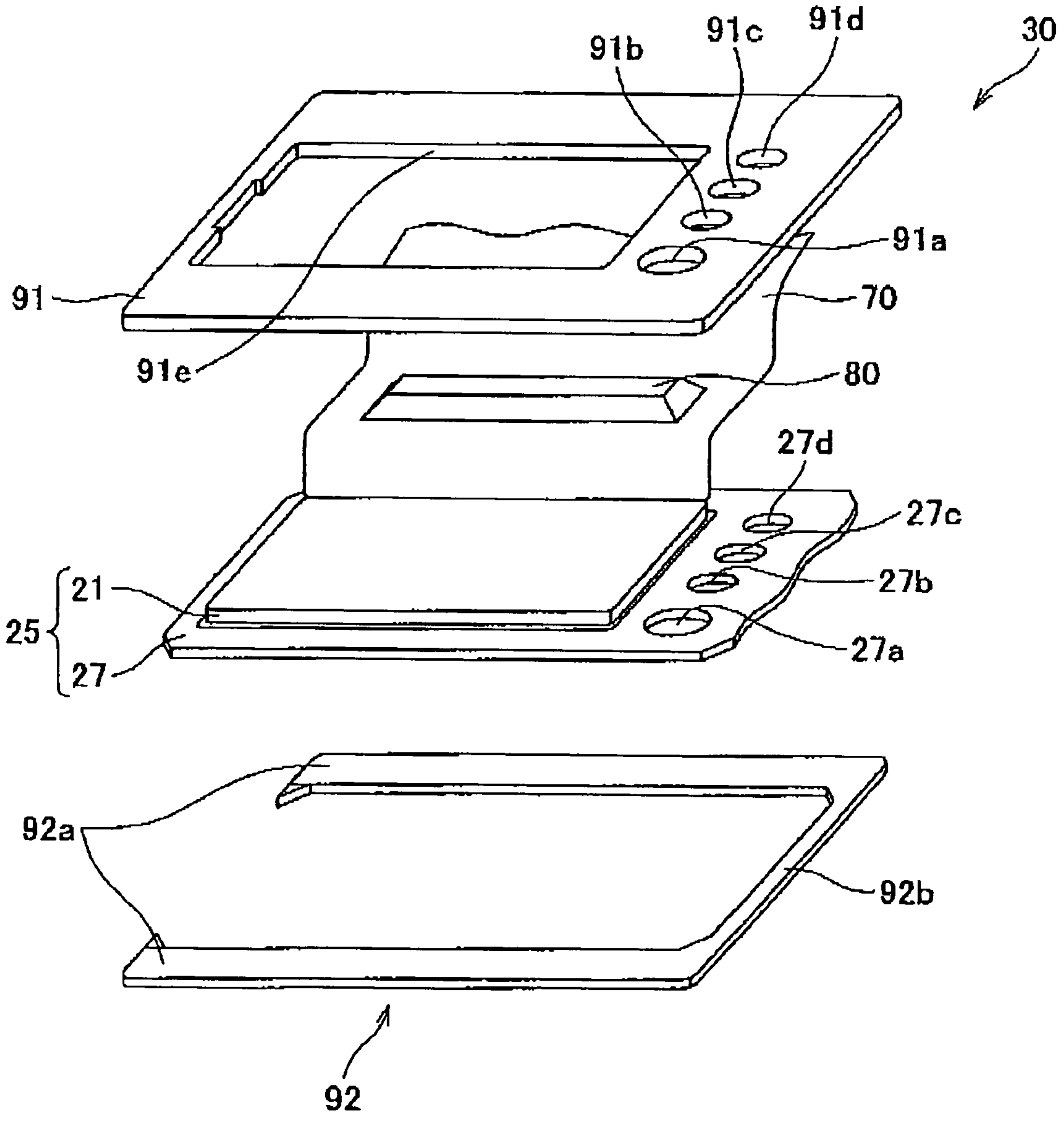
FIG. 4 is an exploded perspective view of the ink jet head shown in FIG. 2.

The ink jet head 30 is explained. FIG. 4 is an exploded perspective view of the ink jet head 30. The ink jet head 30 has the head body 25, a reinforcement frame 91 and a protective frame 92. FIG. 4 shows the respective top surfaces of the head body 25, the reinforcement frame 91 and the protective frame 92.

The head body 25 has the piezoelectric actuator 21 and the flow path unit 27. The flow path unit 27 is constituted by the lamination body so that a plurality of sheet materials having the same rectangular flat shape are laminated, which will be described later (refer to FIG. 5). In the flow path unit 27, ink supply ports 27*a*, 27*b*, 27*c* and 27*d* are formed near one end in its longitudinal direction. The ink supply ports 27*a* to 27*d* are arranged separately from each other, along the short side direction of the head body 25. The ink from the buffer tank 48 are supplied through the ink supply ports 27*a* to 27*d* to the flow path unit 27. Also, the plurality of nozzles for discharging the inks are formed on the lower surface of the flow path unit 27. In this way, the lower surface of the flow path unit 27 corresponds to the nozzle surface 25*a*. Then, the ink flow paths are formed inside the flow path unit 27 so as to be linked from the ink supply ports 27*a* to 27*d* to the nozzles.

Moreover, on the top surface of the flow path unit 27, the piezoelectric actuator 21 which will be described later is placed at the position where the ink supply ports 27*a* to 27*d* are avoided. The piezoelectric actuator 21 constitutes the inner wall of a part (a pressure room which will be described later) of the ink flow path formed in the flow path unit 27 and applies a pressure to the ink inside the ink flow path so that the ink is discharged from the nozzles. The FPC 70 is electrically connected to the piezoelectric actuator 21, as mentioned above.

The reinforcement frame 91 is the platy member that has the rectangular flat shape and is made of metal. An opening 91*e* is formed in the reinforcement frame 91, correspondingly to the piezoelectric actuator 21 of the head body 25. Although this opening 91*e* has the substantially same flat shape as the piezoelectric actuator 21, it is one size larger than the piezoelectric actuator 21. Also, the opening 91*e* is formed so as to be accommodated inside the flow path unit 27. In short, the opening 91*e* is one size larger than the outer shape of the piezoelectric actuator 21, and the outer shape of the flow path unit 27 is one size larger than the opening 91*e*. Also, the opening 91*e* is formed near the center in the short side direction so that one end in the longitudinal direction remains in the reinforcement frame 91.

Ink supply ports 91*a*, 91*b*, 91*c* and 91*d* which penetrate the reinforcement frame 91 in the thickness direction are formed at one end of the longitudinal direction in the reinforcement frame 91. The ink supply ports 91*a* to 91*d* are formed correspondingly to the ink supply ports 27*a* to 27*d* of the flow path unit 27 and arranged separately from each other along the short side direction of the reinforcement frame 91. It is noted that the respective ink supply ports 91*a* to 91*d* have the same shapes as the respective ink supply ports 27*a* to 27*d* formed in the head body 25.

The protective frame 92 is the platy member that has the U-shaped flat shape and is made of metal. The lengths of two parallel arms 92*a* in the U-shaped portion of the protective frame 92 are approximately equal to the length of the longitudinal direction of the reinforcement frame 91. Also, the length of a support portion 92*b* which supports the two arms 92*a* and is vertical to the arms 92*a* is approximately equal to the length of the short side direction of the reinforcement frame 91. The region surrounded with the protective frame 92 having the U-shape when it is viewed from the flat surface, although having the shape substantially similar to the head body 25, is one size larger than the head body 25.

The ink jet head 30 is formed such that those head body 25, reinforcement frame 91 and protective frame 92 are laminated to each other. The head body 25 and the reinforcement frame 91 are laminated to each other so that the piezoelectric actuator 21 is accommodated inside the opening 91*e* formed in the reinforcement frame 91, and the peripheral portion of the piezoelectric actuator 21 on the top surface of the flow path unit 27 and the lower surface of the reinforcement frame 91 are brought into contact with each other. Consequently, the top surface of the piezoelectric actuator 21 is exposed to the upper side from the opening 91*e* of the reinforcement frame 91. Also, the protective frame 92 is laminated to the lower surface of the reinforcement frame 91 so that the flow path unit 27 is surrounded with the U-shaped protective frame 92. In short, the nozzle surface 25*a* of the flow path unit 27 is exposed to the lower side from the U-shaped inner region.

It is noted that the ink supply ports 27*a* to 27*d* formed in the head body 25 and the ink supply ports 91*a* to 91*d* formed in the reinforcement frame 91 are arranged such that, when the reinforcement frame 91 and the head body 25 are laminated to each other, the ink supply ports 91*a* to 91*d* and the ink supply ports 27*a* to 27*d* are linked respectively.

<Structure of Head Body>

Figure 5:
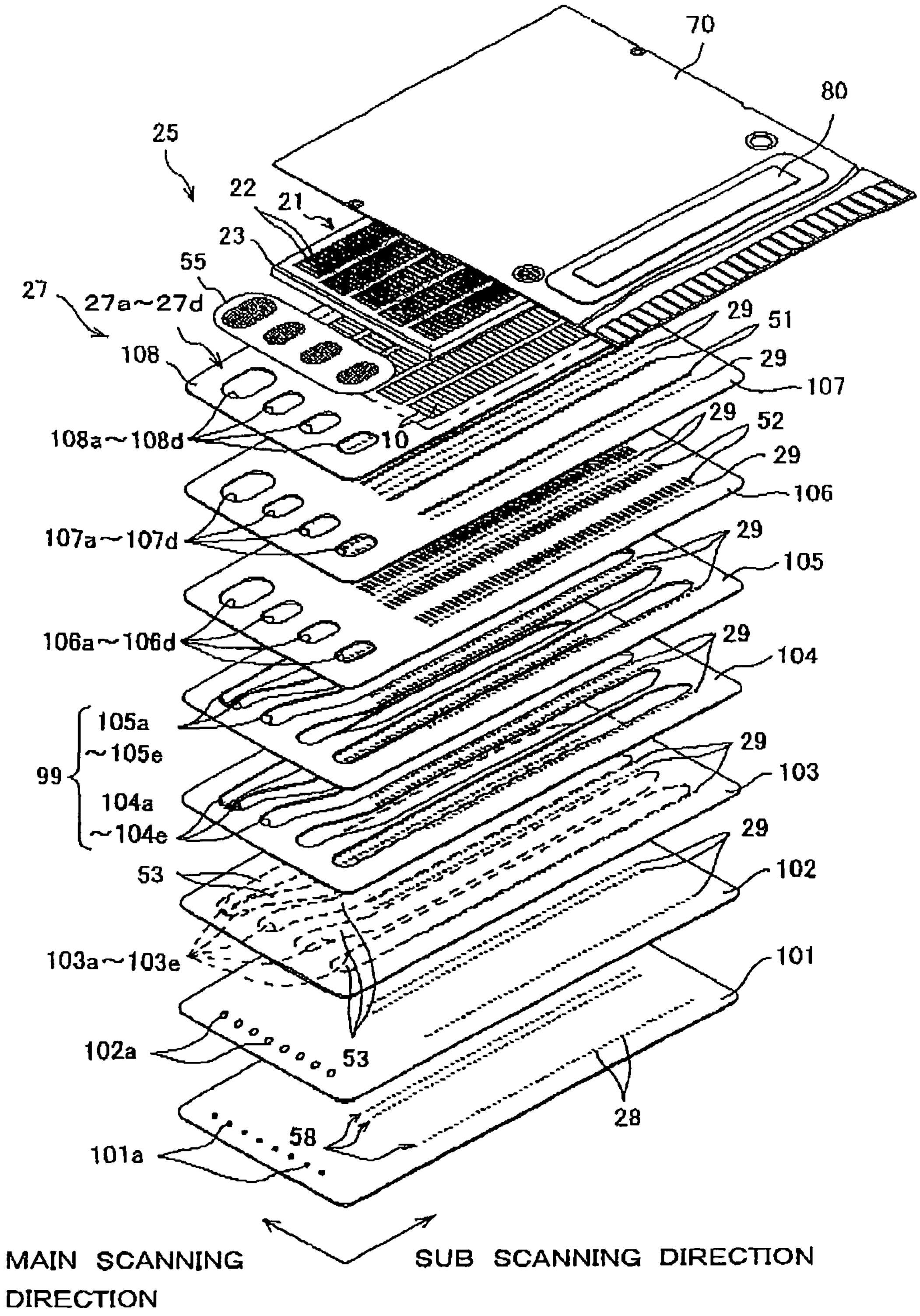
FIG. 5 is an exploded perspective view of a head body, a piezoelectric actuator and FPC, which are shown in FIG. 3.

The detailed structure of the head body 25 will be described below. FIG. 5 is an exploded perspective view of the head body 25 and the FPC 70.

The piezoelectric actuator 21 is placed on the top surface side of the head body 25, as mentioned above. In the piezoelectric actuator 21, a plurality of thin plates having the rectangular flat shape are laminated, which will be described later. Surface electrodes 22, 23 are placed on the top surface of the piezoelectric actuator 21. The surface electrodes 22, 23 are electrically connected to contacts (terminals) (not shown) of the FPC 70 corresponding thereto.

Also, a filter 55 is laminated onto the top surface of the head body 25 (the flow path unit 27) so as to cover the ink supply ports 27*a* to 27*d*. In the filter 55, a plurality of micro holes are formed at the positions opposite to the ink supply ports 27*a* to 27*d*. The inks flowing out from the ink flow outlets (not shown) of the buffer tank 48 are filtered through the filter 55 and poured from the ink supply ports 27*a* to 27*d* into the flow path unit 27.

The flow path unit 27 has the lamination structure where a total of eight sheet materials that are composed of one nozzle plate 101 on which a plurality of nozzles 28 are formed and seven flow path plates 102 to 108 in which flow path holes to supply the inks to the nozzles 28 are formed are laminated. In the flow path unit 27, the flow path plates 102 to 108 are laminated in order starting from the upper portion, such as a cavity plate 108, a supply plate 107, an aperture plate 106, two manifold plates 104, 105, a damper plate 103 and a spacer plate 102. The nozzle plate 101 is located under the spacer plate 102. The respective plates 101 to 108 have the rectangular flat shapes that are long in the sub scanning direction. The flow path plates 102 to 108 are made of stainless steel, and the nozzle plate 101 is made of polyimide resin. It is noted that all of the plates 101 to 108 may be made of stainless steel.

On the nozzle plate 101, a large number of nozzles 28 with micro diameters are formed at micro intervals. Those nozzles 28 are arranged in staggered array along the longitudinal direction (the sub scanning direction) of the nozzle plate 101 and constitute nozzle rows 58 of five rows.

On the cavity plate 108, a plurality of pressure rooms 10 corresponding to the respective nozzles 28 are formed such that the number of the rooms 10 is equal to the number of the nozzles 28. Those pressure rooms 10 are arranged in the 5 rows of the staggered array, along the longitudinal direction of the cavity plate 108. The longitudinal direction of the respective pressure rooms 10 is orthogonal to the longitudinal direction of the cavity plate 108. On the plates 102 to 107, respective penetration holes 29 with micro diameters are formed in the staggered array. One end of the respective pressure rooms 10 and the nozzles 28 on the nozzle plate 101 is linked through those penetration holes 29. Those penetration holes 29 constitute the penetration hole row along the longitudinal direction in the respective plates.

Also, penetration holes 108*a*, 108*b*, 108*c* and 108*d* are formed at one end for the longitudinal direction in the cavity plate 108. The openings on the top surface side of the flow path unit 27 in the penetration holes 108*a* to 108*d* correspond to the ink supply ports 27*a* to 27*d*. That is, the penetration holes 108*a* to 108*d* are arranged in the order of a, b, c and d to the front direction from the depth of FIG. 5 along the short side direction (the main scanning direction) of the cavity plate 108. It is noted that among the 4 penetration holes 108*a* to 108*d*, the penetration hole 108*a* has the opening which is one size larger than those of the other penetration holes 108*b* to 108*d*.

On the supply plate 107, linkage holes 51 whose number is equal to the number of the nozzles 28 are formed in addition to the penetration holes 29 linked to the nozzles 28. Those linkage holes 51 penetrate the supply plate 107 in the thickness direction. Also, those linkage holes 51 are arranged in five rows of the staggered array along the longitudinal direction of the supply plate 107. One opening of the respective linkage holes 51 is linked to the other ends of the pressure rooms 10 corresponding thereto. Also, the other openings of the respective linkage holes 51 are linked to apertures 52 corresponding thereto, which will be described later.

Also, on the supply plate 107, penetration holes 107*a*, 107*b*, 107*c* and 107*d* having the same shape and same size as the penetration holes 108*a* to 108*d* are formed on one end side of the longitudinal direction. The respective penetration holes 107*a* to 107*d* are arranged opposite to the respective penetration holes 108*a* to 108*d* of the cavity plate 108.

The apertures 52 whose number is equal to the number of the nozzles 28 are formed on the aperture plate 106, in addition to the penetration holes 29. Those apertures 52 are arranged in five rows of the staggered array along the longitudinal direction of the aperture plate 106. Each of the apertures 52 has the rectangular flat shape and is extended along the short side direction of the aperture plate 106. Also, one end of each aperture 52 is linked to the linkage hole 51, and the other end is linked to a common ink room 99, which will be described later. In the aperture 52, a section area vertical to a direction from the one end to the other end is set to a predetermined value. In short, in such a way that the aperture 52 has a particular flow path resistance, its section shape, section area and length are defined. Thus, the flow of the ink that oppositely flows to the side of the common ink room 99 from the pressure room 10 is limited when the ink is discharged.

Also, on the aperture plate 106, penetration holes 106*a*, 106*b*, 106*c* and 106*d* having the same shape and same size as the penetration holes 107*a* to 107*d* are formed on one end side of the longitudinal direction. The respective penetration holes 106*a* to 106*d* are arranged so as to be opposite to the respective penetration holes 107*a* to 107*d* of the supply plate 107.

In the situation that the cavity plate 108, the supply plate 107 and the aperture plate 106 are laminated, the penetration holes 106*a* to 106*d* and the penetration holes 107*a* to 107*d* and the penetration holes 108*a* to 108*d* are linked to each other. Consequently, the ink flow paths to flow the inks from the ink supply ports 27*a* to 27*d* through the penetration hole 106*a* and the like into the flow path unit 27 are formed.

Five ink room half portions 105*a*, 105*b*, 105*c*, 105*d* and 105*e* which penetrate the thickness direction are formed on the manifold plate 105 on the side of the aperture plate 106, among the two manifold plates 104, 105. The ink room half portions 105*a* to 105*e* are extended along the longitudinal direction of the manifold plate 105 so as to avoid the penetration hole row composed of the penetration holes 29. The ink room half portions 105*a* to 105*e* are arranged in the order from a, b, c, d and e to the front direction from the depth of FIG. 5, along the short side direction of the manifold plate 105. Also, the ink room half portions 105*a* to 105*e* are arranged separately from and parallel to each other.

Ink room half portions 104*a*, 104*b*, 104*c*, 104*d* and 104*e*, which have the same shape and same size as the ink room half portions 105*a* to 105*e* and penetrate the thickness direction similarly to the ink room half portions 105*a* to 105*e*, are formed on the manifold plate 104 on the side of the damper plate 103 among the manifold plates 104, 105.

In the situation that the two manifold plates 104, 105, the aperture plate 106 and the damper plate 103 are laminated, the ink room half portions 104*a* to 104*e* and 105*a* to lose are connected to each other, oppositely to each other. Also, one opening of the ink room half portions 104*a* to 104*e* and 105*a* to 105*e* is covered with the aperture plate 106, and the other openings are covered with the damper plate 103. Consequently, one ink room is constituted by the opposite two ink room half portions, and a total of five common ink rooms 99 are formed. Those common ink rooms 99 are extended in the region where the penetration hole 29 in the two manifold plates 104, 105 is not formed.

In the situation that the aperture plate 106 and the manifold plate 105 are laminated, the penetration hole 106*a* is linked to the ink room half portions 105*a*, 105*b*. Also, the respective penetration holes 106*b* to 106*d* are linked to the respective ink room half portions 105*c* to 105*e*. Consequently, the same ink is supplied from one ink supply port 27*a* to the two common ink rooms 99 located deeply towards FIG. 5, among the five common ink rooms 99. Also, the inks are supplied to the other three common ink rooms 99, from the respective ink supply ports 27*b* to 27*d* corresponding thereto. In this embodiment, the black ink is supplied to the two common ink rooms 99 arranged deeply towards FIG. 5. Also, the inks are supplied in the order of yellow, magenta and cyan to the three common ink rooms 99 arranged deeply from the front side of FIG. 5.

Damper grooves 103*a*, 103*b*, 103*c*, 103*d* and 103*e* are formed on the surface of the side of the spacer plate 102 in the damper plate 103. The damper grooves 103*a* to 103*e* are formed such that the longitudinal section along the short side direction of the damper plate 103 has the shape of the concave groove. The damper grooves 103*a* to 103*e* are extended along the longitudinal direction of the damper plate 103. The respective damper grooves 103*a* to 103*e* have the same shape and same size as the corresponding respective common ink rooms 99 and are located opposite to the respective common ink rooms 99.

In the situation that the manifold plates 104, 105 and the damper plate 103 are laminated, a damper portion 53 is placed at the portion opposite to the common ink room 99 of the damper plate 103. The thin thickness portion in the damper portion 53 of the damper plate 103 can be suitably elastically deformed and can be freely vibrated on the side of the common ink room 99 and the side of the damper groove 103*a*. Thus, even if the pressure fluctuation generated in the pressure room 10 when the ink is discharged is transmitted to the common ink room 99, the thin thickness portion in the damper portion 53 opposite to the common ink room 99 is elastically deformed. Consequently, since the pressure fluctuation transmitted to the common ink room 99 is absorbed and attenuated by the damper portion 53, there is no influence on the ink discharge of the adjacent pressure room 10.

On the spacer plate 102, the penetration holes 29 linked to the nozzles 28 are formed and a plurality of dummy holes 102*a* are formed which will be described later. The dummy holes 102*a* are arranged near the end close to the position where the ink supply port 27*a* and the like are formed at the time of the completion of the flow path unit 27. Then, the plurality of dummy holes 102*a* are arranged along the short side direction of the spacer plate 102. Also, on the nozzle plate 101, a plurality of dummy nozzle holes 101*a* are formed together with the nozzles 28. The dummy nozzle holes 101*a* are formed at the positions opposite to the dummy holes 102*a* of the spacer plate 102. The reason why the dummy holes 102*a* and the dummy nozzle holes 101*a* are arranged at the opposite positions is that the dummy nozzle holes 101*a* are formed through the dummy holes 102*a* at the later manufacturing step.

The flow path unit 27 has the lamination structure where the respective plates 101 to 108 having the foregoing configurations are laminated. With the lamination structure, inside the flow path unit 27, the plurality of ink flow paths are formed from the ink supply ports 27*a* to 27*d*, through the common ink rooms 99, the apertures 52, the linkage holes 51, the pressure rooms 10 and the penetration holes 29 (hereafter, referred to as flow holes) to the nozzles 28. The inks that flow from the buffer tank 48 through the ink supply ports 27*a* to 27*d* to the flow path unit 27 are once accumulated in the common ink rooms 99. Then, they are supplied through the apertures 52 to the respective pressure rooms 10. In the pressure rooms 10, the inks to which the pressures are applied by the piezoelectric actuator 21 are discharged through the respective penetration holes 29 from the corresponding nozzles 28.

<Piezoelectic Actuator>

Figure 6:
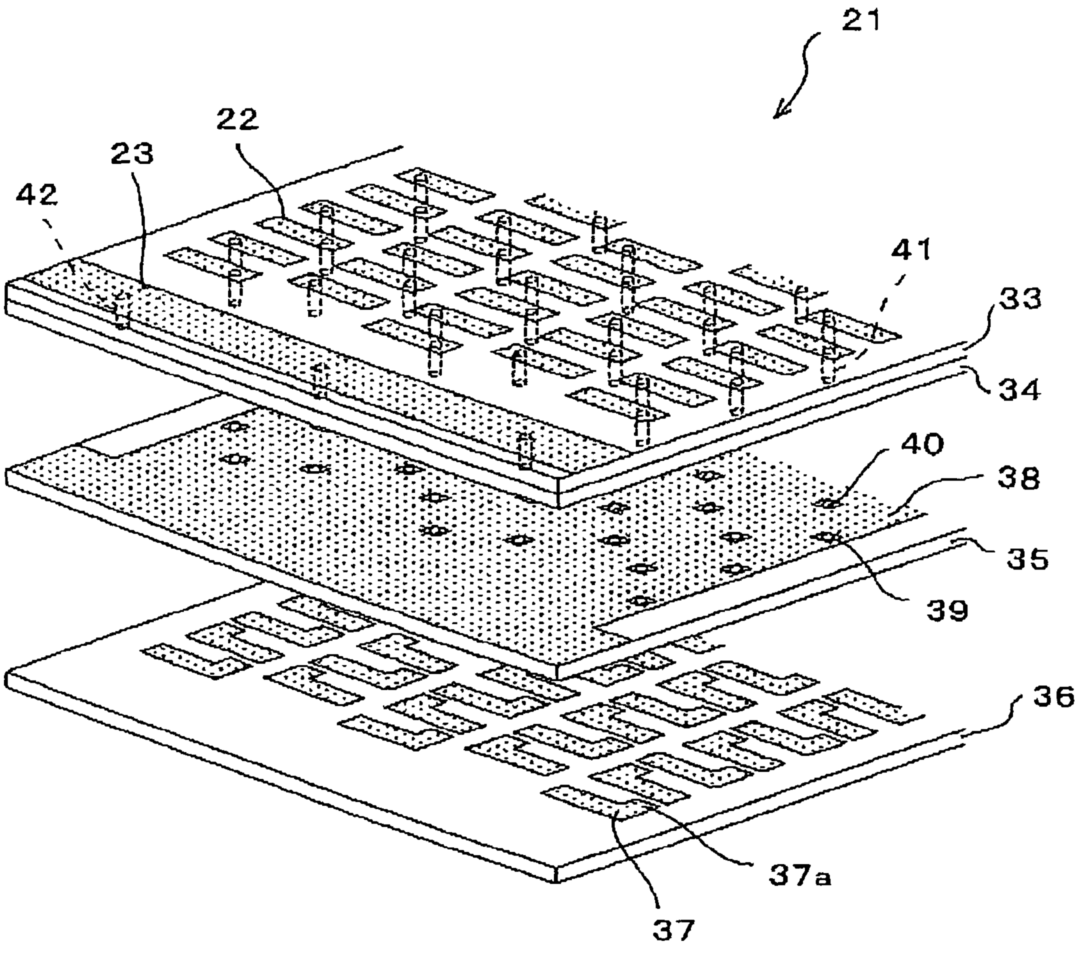
FIG. 6 is an exploded perspective view of the piezoelectric actuator shown in FIG. 3.

The piezoelectric actuator will be described below. FIG. 6 is an exploded perspective view of a main portion of the piezoelectric actuator 21 shown in FIG. 5.

In the piezoelectric actuator 21, two insulation sheets 33, 34 and two piezoelectric sheets 35, 36 are laminated. On the top surface of the piezoelectric sheet 36, a plurality of individual electrodes 37 are formed so as to be arranged oppositely to the respective pressure rooms 10 in the flow path unit 27. Those individual electrodes 37 are arranged in five rows of the staggered array along the longitudinal direction of the piezoelectric sheet 36, correspondingly to the array of the pressure rooms 10. Each of the individual electrodes 37 has the portion of the rectangular flat shape that is long in the short side direction of the piezoelectric sheet 36. Also, each of the individual electrodes 37 has a pull portion 37*a* that is extended in the longitudinal direction of the piezoelectric sheet 36 from one end for the longitudinal direction in its rectangular portion. It is noted that any of the pull portions 37*a* is pulled up to the region that is not opposite to the pressure room 10 in the piezoelectric sheet 36.

On the top surface of the piezoelectric sheet 35, a common electrode 38 straddling the plurality of pressure rooms 10 is placed. On the top surface of the piezoelectric sheet 35, a plurality of non-formation regions 39 where the common electrode 38 is not formed are arranged, and a penetration hole 40 that penetrates the thickness direction of the piezoelectric sheet 35 is formed in each of the non-formation regions 39. The penetration hole 40 is filled with a conductive member in situation that it is electrically insulated from the common electrode 38. Each of the non-formation regions 39 is formed at the position opposite to the pull portion 37*a* of each of the individual electrodes 37.

On the top surface of the insulation sheet 33 of the highest layer (namely, the top surface of the piezoelectric actuator 21), the surface electrode 22 corresponding to each of the individual electrodes 37 and the surface electrode 23 are placed. The surface electrode 22 is placed in the region that is not opposite to the pressure room 10 in the insulation sheet 33, so as to be opposite to the penetration hole 40 (or the pull portion 37*a*). Then, it is arranged in five rows of the staggered array along the longitudinal direction of the piezoelectric actuator 21, correspondingly to each of the individual electrodes 37. The surface electrode 23 is extended along the short side direction of the piezoelectric actuator 21, near one end for the longitudinal direction in the insulation sheet 33.

In the insulation sheets 33, 34, a plurality of continuous holes 41 that penetrate the thickness directions of the insulation sheets 33, 34 are formed at the positions opposite to the penetration hole 40, in the region opposite to the pull portion 37*a* and the surface electrode 22. Also, in the insulation sheets 33, 34, three continuous holes 42 are formed separately along the short side direction of the insulation sheets 33, 34, in the region opposite to the common electrode 38 and the surface electrode 23. The continuous holes 41, 42 are filed with conductive materials.

The piezoelectric actuator 21 has the lamination structure where the insulation sheets 33, 34 and the piezoelectric sheets 35, 36, which have the foregoing configurations, are laminated in the order starting from the upper portion. In the lamination structure, the penetration hole 40 and the continuous holes 41 are positioned so as to be just opposite to each other. Consequently, a plurality of through holes are formed such that the penetration hole 40 and the continuous holes 41 are linked and the insulation sheets 33, 34 and the piezoelectric sheet 35 are penetrated. Since those through holes are filed with the conductive materials as mentioned above, the surface electrodes 22 and the individual electrodes 37 are electrically connected respectively. Also, since the continuous holes 42 formed in the insulation sheets 33, 34 are filed with the conductive members as mentioned above, the surface electrode 23 and the common electrode 38 are electrically connected.

With the foregoing configurations, the respective individual electrodes 37 of the piezoelectric actuator 21 are connected through the surface electrode 22 to respective individual wirings (not shown) of the FPC 70. Also, the common electrode 38 is connected through the surface electrode 23 to a common wiring (not shown) of the FPC 70. Then, the respective individual wirings are connected to the driver IC 80.

On the other hand, the driver IC 80 converts a print signal which is serial-transferred from a controller (not shown) of the printer 1, into a corresponding parallel signal for each individual electrode 37 of the piezoelectric actuator 21. Also, the driver IC 80 generates a drive signal having a predetermined voltage pulse, in accordance with the print signal. Then, the driver IC 80 outputs the generated drive signal to each individual wiring connected to each individual electrode 37. It is noted that the common wiring is always held at a ground potential.

Thus, the drive voltage (drive signal) from the driver IC 80 is selectively applied between any individual electrode 37 of the piezoelectric actuator 21 and the common electrode 38. When a non-zero voltage is applied between the individual electrode 37 and the common electrode 38, distortion in the lamination direction is induced in an active portion sandwiched between the common electrode 38 and the individual electrode 37 in the piezoelectric sheet. Then, the distortion induced in the active portion causes a pressure to be applied to the ink inside the pressure room 10 in the cavity plate 108, and the ink is discharged from the nozzles 28.

<Manufacturing Method>

Figure 7:
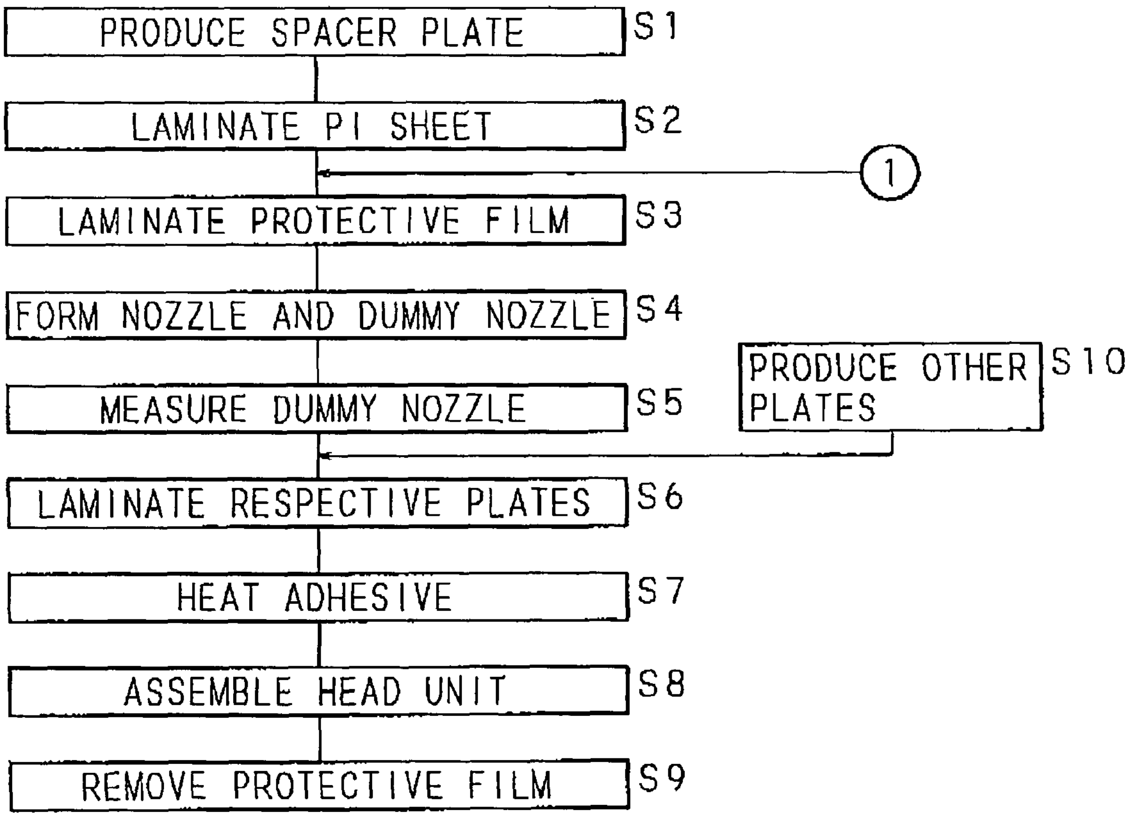
FIG. 7 is a flowchart showing a series of steps according to the manufacturing method of the ink jet head that is one embodiment.

FIG. 7 is a flowchart showing a series of manufacturing steps according to the manufacturing method of the ink jet head in this embodiment. The series of the steps will be described below.

At first, the spacer plate 102 to be included in the flow path unit 27 is produced (S1). When the spacer plate 102 is produced, the metal plate is firstly cut to the outer shape of the spacer plate 102 (a first plate). Then, the flow path holes (the penetration holes 29) are formed on the cut plate. Moreover, the dummy holes 102*a* are formed on this plate.

Next, a PI (polyimide resin) sheet (a second plate) to be the nozzle plate 101 is laminated to the spacer plate 102 (S2). The PI sheet is preliminarily cut to the size, which includes the region where the nozzles are formed and is smaller than the spacer plate 102.

Next, the protective film is laminated to a complex plate where the spacer plate 102 and the PI sheet are laminated to each other (hereafter, merely referred to as [Complex Plate]) (S3). The protective film is laminated to the side to which the PI sheet of the complex plate is laminated, by using a lamination process so as to sandwich the PI sheet together with the spacer plate 102.

Next, excimer laser is irradiated through the flow path holes (the penetration holes 29) formed on the spacer plate 102, and the nozzles 28 are formed on the PI sheet. At this time, the dummy nozzle holes 101*a* are formed together with the nozzles 28 (S4).

Next, the diameter and the like of the dummy nozzle hole 101*a* as the nozzle 28 is measured (S5). Consequently, the precision in the information of the nozzle 28 is inspected.

Next, the complex plate and the other flow path plates 103 to 108 except the spacer plate 102 are laminated through thermosetting adhesive (S6). Consequently, the lamination of the flow path unit 27 is completed. It is noted that the flow path plates 103 to 108 are preliminarily produced prior to the lamination of the complex plate (S10). Those flow path plates 103 to 108 are produced by cutting the metal plate (first plate) and then forming the flow path holes, similarly to the spacer plate 102.

Next, the plates laminated through the adhesives are heated (S7). Consequently, the adhesives existing in the respective plates are cured, thereby completing the flow path unit 27.

Next, the piezoelectric actuator 21 is laminated to the completed flow path unit 27, and the head body 25 is completed. Then, the FPC 70 is connected to the head body 25, and the head body 25 is attached to the head holder 9. Moreover, the buffer tank 48 is placed in the head body 25, and the heat sink 60 is placed inside the head holder 9. Through the foregoing assembling works, the head unit 8 is completed (S8). It is also noted that at the step of placing the buffer tank 48, the protective film is still laminated.

Finally, the protective film that is still laminated to the nozzle plate 101 of the flow path unit 27 included in the head body 25 is removed (S9).

<Formation of Flow Path Hole>

Figure 8A:
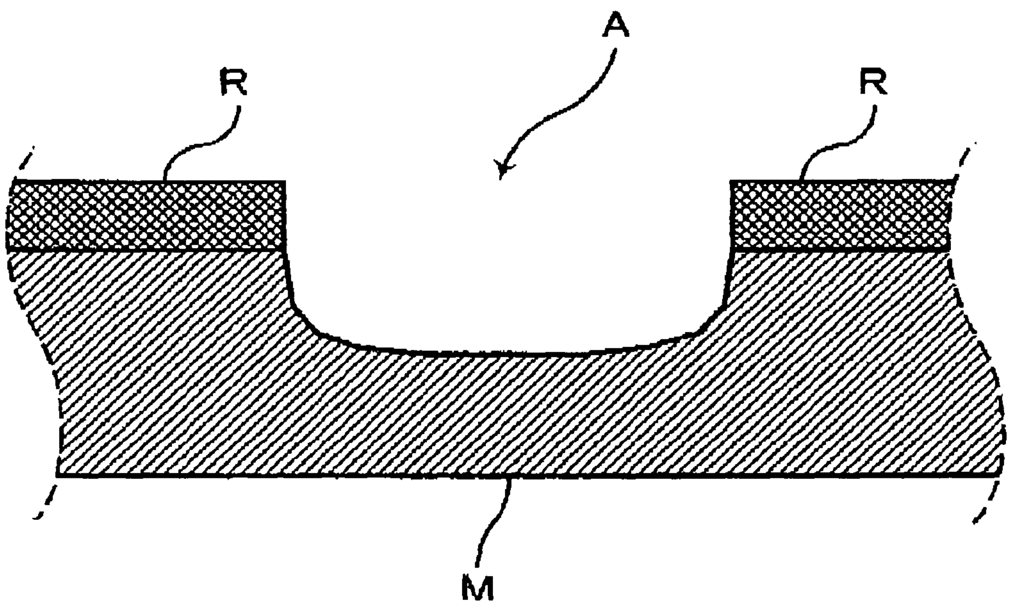
FIGS. 8A and 8B are lateral sectional views showing a step of forming flow path holes in the step of producing each plate shown in FIG. 7.
Figure 8B:
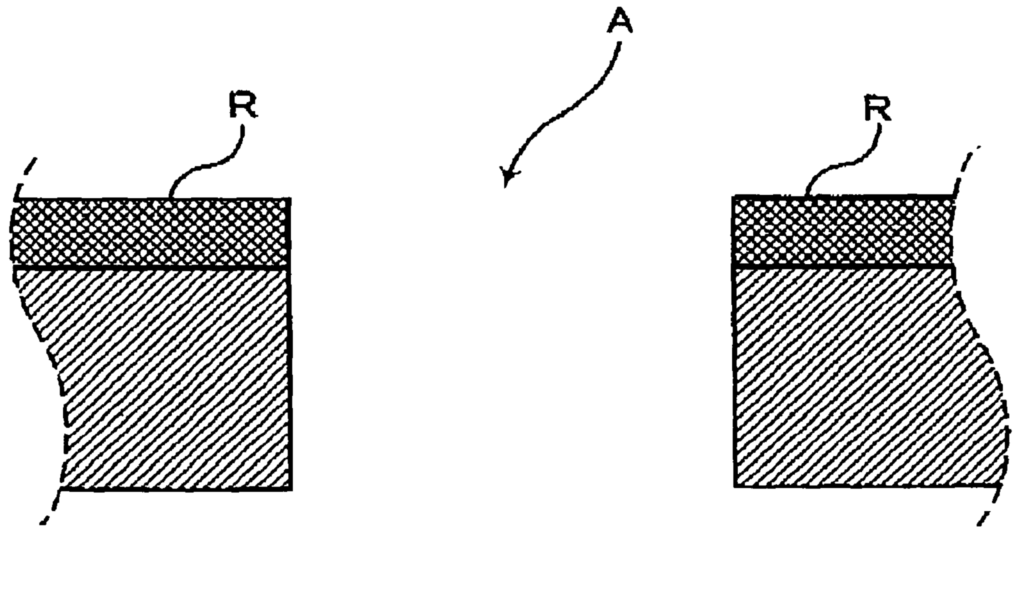

The followings are the detailed explanations related to the foregoing respective steps. FIGS. 8A and 8B are views showing the flow path hole forming step (S1 and S10 of FIG. 7) of forming the flow path holes, such as the common ink rooms 99, the apertures 52, the linkage holes 51, the pressure rooms 10, the penetration holes 29 and the like, on the respective metal plates constituting the flow path unit 27.

Each flow path hole is formed on each metal plate by etching. At first, a resist material R of a positive type or negative type is placed on the surface of a metal plate M. Moreover, the mask having the same mask portion as the at shape of the flow path hole or a non-mask portion is placed on the resist material R. The position and shape of the mask portion or non-mask portion are adjusted such that the ink flow path is formed from the common ink room 99 to the nozzle 28, because the flow path holes are linked to each other, when the flow path unit 27 has been completed. It is noted that, which of the mask portion or the non-mask portion is set to the same shape as the flow path hole is based on whether the type of the resist material R is positive or negative. After the arrangement of the resist material R, light is irradiated from above the mask. Thus, the resist material R is exposed. When the metal plate M to which the light is irradiated is immersed in a developer, only the resist material R opposite to the region where the flow path hole is to be formed begins to dissolve in the developer.

Next, etching agent is coated on the surface of the metal plate M covered with the resist material R. Thus, as shown in FIG. 8A, a region A that is not covered with the resist material R on the metal plate M is gradually dissolved from the surface by the etching agent. As shown in FIG. 8B, after the elapse of a certain time, the penetration holes are formed on the region A of the metal plate M. After that, the etching agent and the resist material R are removed from the surface of the metal plate M. In this way, the flow path holes penetrating the metal plate M are formed.

It is noted that the flow path hole which does not penetrate the metal plate and the like are formed by half-etching. That is, after the etching agent is coated on the metal plate covered with the resist material, before the hole formed by the dissolution resulting from the etching agent perfectly penetrates the plate, the etching is stopped and the resist material is removed. Thus, the flow path hole that does not penetrate the plate is formed.

At the S1 and S10 of FIG. 7, since the respective flow path holes are formed as mentioned above, the flow path plates 102 to 108 are formed. It is noted that the dummy holes 102*a* together with the penetration holes 29 serving as flow path holes are formed on the spacer plate 102 by the etching. The dummy holes 102*a* are formed so as to be larger than the openings on the side opposite to the discharging ports in the nozzles 28 formed on the nozzle plate 101, which will be described later. Also, the dummy holes 102*a* are formed so as to be located at the position near the end close to the position where the ink supply port 27*a* and the like are formed when the flow path unit 27 is completed (refer to FIG. 5).

<Laminating of Complex Plate and Protective Film>

Figure 9:
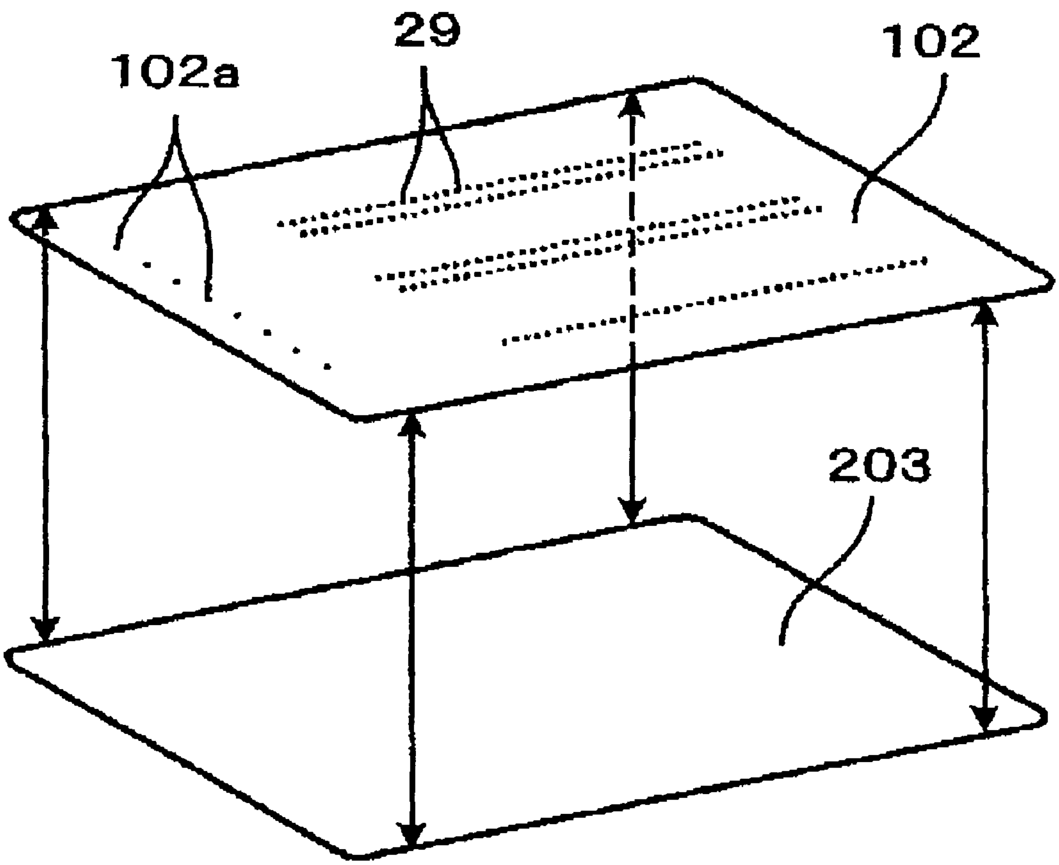
FIG. 9 is a perspective view showing a step of laminating a spacer plate and a PI sheet shown in FIG. 7.
Figure 10A:
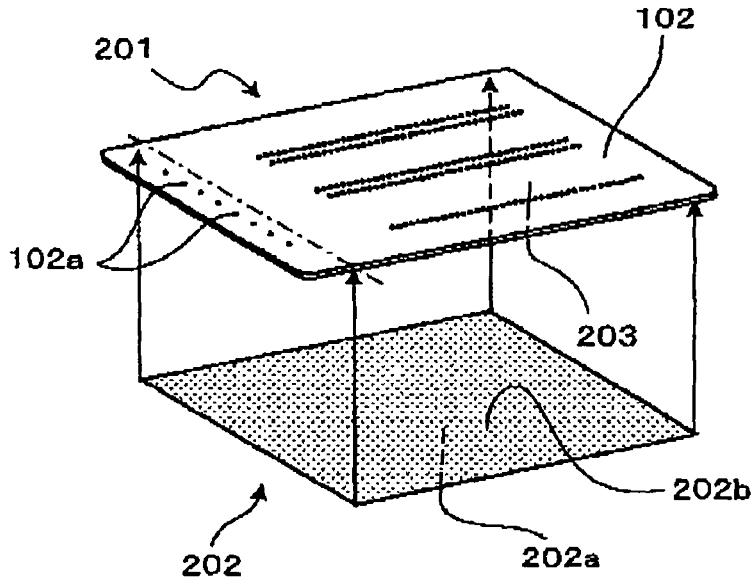
FIGS. 10A and 10B are perspective views showing a step of laminating a protective film shown in FIG. 7.
Figure 10B:
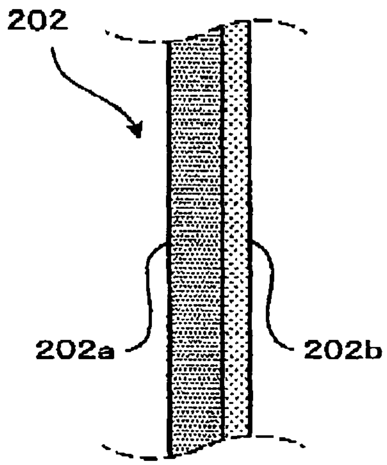

FIGS. 9A, 10A and 10B are views showing the step of laminating a complex plate 201 and a protective film 202 to each other (S2, S3 of FIG. 7). As shown in FIG. 9, the spacer plate 102 where the penetration holes 29 and the dummy holes 102*a* are formed and a PI sheet 203 to be later the nozzle plate 101 are laminated to each other. Consequently, the complex plate 201 composed of the spacer plate 102 and the PI sheet 203 is formed. It is noted that, when the nozzle plate 101 is constituted by the metal plate, the metal plate to be the nozzle plate 101 and the spacer plate 102 are laminated to each other through adhesive and the like.

Next, as shown in FIG. 10A, the protective film 202 is laminated to the formed complex plate 201 by using the lamination process. The protective film 202 is laminated to the portion closer to one end with respect to an alternate long and short dash line of FIG. 10A, on the surface of the PI sheet 203, so as not to cover the vicinity of the position opposite to the dummy hole 102*a*. The protective film 202 has the size and shape so as to perfectly cover the region opposite to the penetration holes 29 when it is laminated to the complex plate 201 (the PI sheet 203).

Moreover, the protective film 202 is formed so as to cover the surface of the PI sheet 203 up to the region that is as close as possible to the position where the dummy hole 102*a* is formed, as shown in FIG. 10A. Also, it is formed so as to cover the surface of the PI sheet 203 up to the region that is as close as possible to the end on the side opposite to the position where the dummy holes 102*a* are formed. Then, as mentioned above, the dummy holes 102*a* are arranged in the vicinity of the end close to the position where the ink supply port 27*a* and the like are formed. For this reason, the protective film 202 laminated to the PI sheet 203 covers the maximally wide region except the vicinity of the end where the dummy holes 102*a* are formed.

The protective film 202 is composed of a base film 202*a* and an adhesive member 202*b* (a second adhesive), as shown in FIG. 10B. The protective film 202 is laminated to the complex plate 201 so that the adhesive member 202*b* and the surface of the PI sheet 203 are closely laminated, and lamination-processed. Materials which have high heat resistance properties and can endure a temperature higher than a curing temperature of a thermosetting adhesive are used in both the base film 202*a* and the adhesive member 202*b*. As the material of the base film 202*a*, for example, PET (polyethylene terephthalate) and the like are used. The thickness of the base film 202*a* is about 50 to 70 μm. In the thickness of this degree, the tension is easily held when they are laminated to each other, and the laminating operation is easy as compared with the thicker case. Also, in the excessively thick case, it is difficult to transmit the heat to the flow path unit 27 at the heating step.

Or, when a large number of micro holes for adsorption are formed on at least one surface of the protective film 202 and then the protective film is laminated to the PI sheet 203, the inner surfaces of the respective micro holes may be configured to be adsorbed on the surface of the PI sheet. Or, the protective film 202 may have the lamination structure where the sheet having the porous structure for adsorption as mentioned above and the base film composed of PET are laminated. With such configuration, the protective film and the PI sheet can be laminated to each other through the adhesive member. Moreover, for example, with an electrostatic action or a magnetic action or the like, the protective film can be adsorbed and consequently laminated to the PI sheet.

As the material of the adhesive member 202*b* in the protective film 202, a pressure sensitive adhesive having a high heat resistance property, such as an acryl group and the like, is used. The thickness of the adhesive member 202*b* is about 10 μm. Also, in such a way that the protective film 202 is surely laminated to the complex plate 201 and easily removed from the complex plate 201 with a hand or the like, an adhesion degree of the pressure sensitive adhesive used in the adhesive member 202*b* is preferred to be about 0.2N/25 mm power. It is noted that as the material of the base film 202*a*, PI may be used similarly to the nozzle plate 101. Also, as the pressure sensitive adhesive, the silicon-based adhesive may be used.

<Formation of Nozzle>

Figure 11:
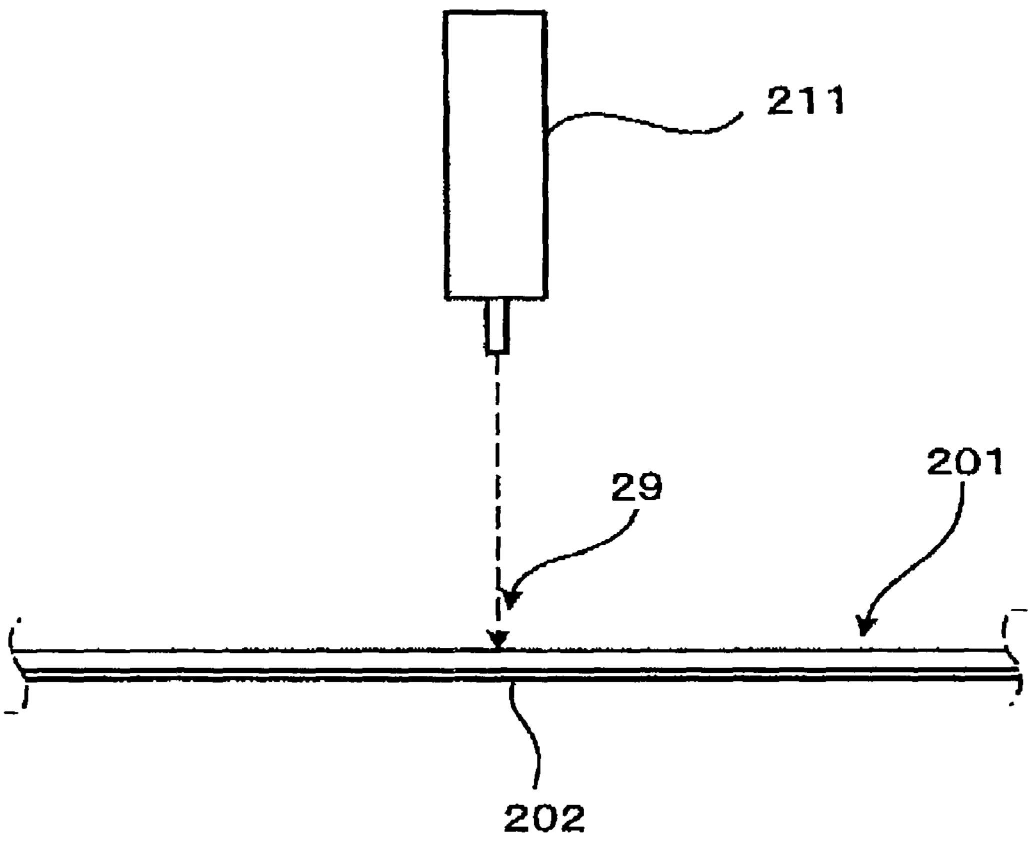
FIG. 11 is a front view showing a step of forming nozzles and dummy holes shown in FIG. 7.

FIG. 11 is a view showing a nozzle forming step of forming the nozzle 28 on the complex plate 201 (the S4 of FIG. 7). The nozzle 28 is formed on the PI sheet 203 through the penetration hole 29 by means of the laser irradiated by an excimer laser irradiator 211. In short, the complex plate 201 is arranged such that the spacer plate 102 is opposite to the excimer laser irradiator 211. Then, the position of the complex plate 201 is adjusted such that the penetration hole 29 is located at the irradiation target of the laser of the excimer laser irradiator 211. Then, since the laser is irradiated through the penetration hole 29 to the PI sheet 203, the nozzle 28 is formed at the position opposite to the penetration hole 29 in the PI sheet 203.

Also, the position of the complex plate 201 is adjusted such that the dummy hole 102*a* is located at the irradiation target of the laser from the excimer laser irradiator 211. Then, since the laser is irradiated through the dummy hole 102*a* to the PI sheet 203, the dummy nozzle hole 101*a* is formed at the position opposite to the dummy hole 102*a* in the PI sheet 203. The protective film 202 is laminated such that the region of the formation of the dummy hole 102*a* is avoided as mentioned above. Thus, the dummy nozzle hole 101*a* is formed at the position where the protective film 202 is avoided. Also, the dummy nozzle hole 101*a* is formed in the same size and shape as the nozzle 28.

In this way, the laser irradiation is repeated. Thus, when all of the nozzles 28 and the dummy nozzle holes 101*a* are formed on the PI sheet 203, the nozzle plate 101 is completed.

Furthermore, if the nozzles 28 are formed under the non-existence of the protective film 202, the scar caused by the laser irradiation and the residue when the PI sheet 203 is dissolved by the laser irradiation are apt to be generated in the vicinity of the opening on the surface of the side of the nozzle plate 101, with regard to the discharging ports of the nozzles 28, namely, the complex plate 201. Then, the deterioration is apt to occur in the discharge property of the ink discharged from the nozzles 28. On the other hand, if the nozzles 28 are formed in the situation that the protective film 202 is still laminated to the surface of the PI sheet 203, the foregoing residue is deposited on the protective film 202 and removed later together with the protective film 202. Also, with the protective film 202, the scar and the like are difficult to occur in the vicinity of the discharging ports of the nozzles 28. Thus, the deterioration is difficult to occur in the discharge property of the nozzles 28.

Also, the discharging ports of the nozzles 28 are formed in the region where the protective film 202 is laminated. Thus, when the complex plate 201 and the other flow path plates are laminated to each other, the protective film 202 is not required to be removed from the nozzle plate 101.

<Measurement of Nozzle>

Figure 12:
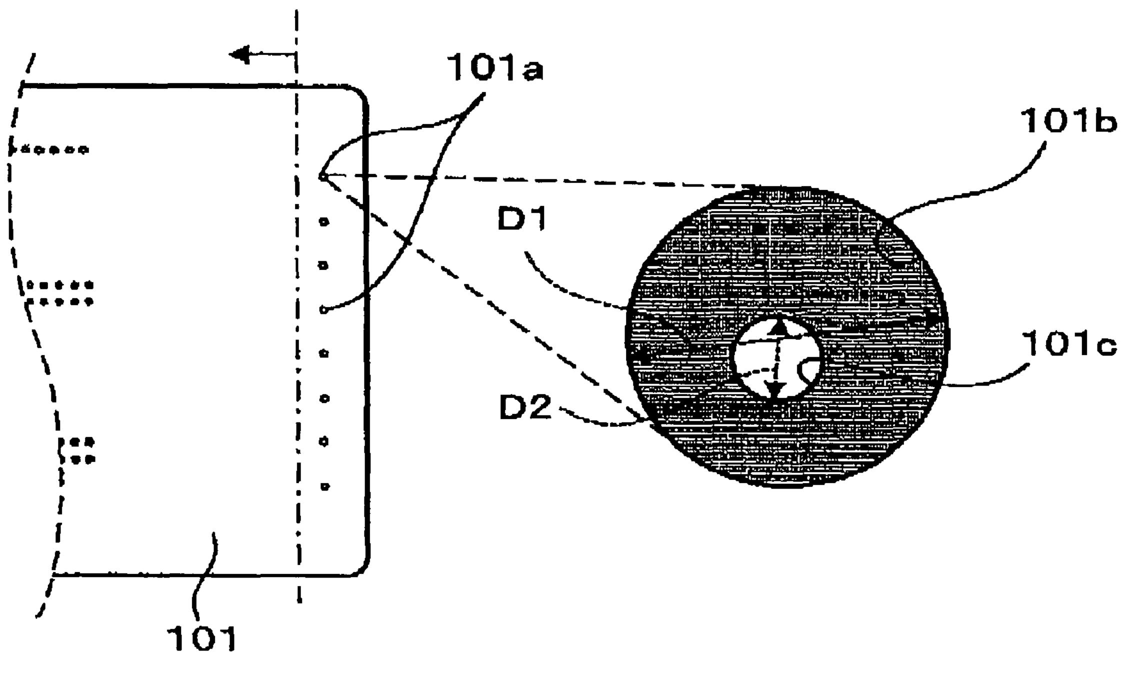
FIG. 12 is a top view showing a step of measuring the nozzles shown in FIG. 7 and its partially enlarged view.

FIG. 12 is a view showing a measuring step of measuring the precision of the formation of the dummy nozzle hole 101*a* after the completion of the nozzle plate 101 (S5 of FIG. 7)

This measuring step is executed in order to inspect the precision of the formation of the nozzle 28. Since this measuring step is executed in the situation that the protective film 202 is still laminated, the number of the steps is small as compared with the case that after the removal of the protective film 202, the measurement is executed and the protective film is again laminated after that. On the other hand, with the protective film 202, the region where the nozzles 28 are formed (the region indicated in the arrow direction from an alternate long and short dash line of FIG. 12) is covered, which causes the direct measurement of the nozzles 28 to be difficult. For this reason, in this measuring step, the dummy nozzle hole 101*a* that is formed so as to have the size and shape similar to the nozzle 28 is measured. Also, the dummy nozzle hole 101*a* is formed such that the region where the protective film 202 is laminated is avoided, as mentioned above. Since the dummy nozzle hole 101*a* is measured without any removal of the protective film 202, the precision of the formation of the nozzle 28 can be inspected similarly to the case of measuring the nozzle 28 after the removal of the protective film 202.

The nozzle 28 is formed such that the longitudinal section is taper-shaped. In short, in the nozzle plate 101, the nozzle 28 has the shape that it lessens towards the discharging port from the opening on the side opposite to the discharging port. In this measuring step, measured are diameters D1 and D2 and a circularity and a concentricity and the like of a shape 101*b* of the opening corresponding to the opening on the side opposite to the discharging port of the nozzle 28 and a shape 101*c* of the discharging port, in the dummy nozzle hole 101*a* having the shape similar to the nozzle 28. The measurement is executed by using a microscope, a laser light and the like.

<Laminating between Flow Path Plate and Complex Plate>

Figure 13:
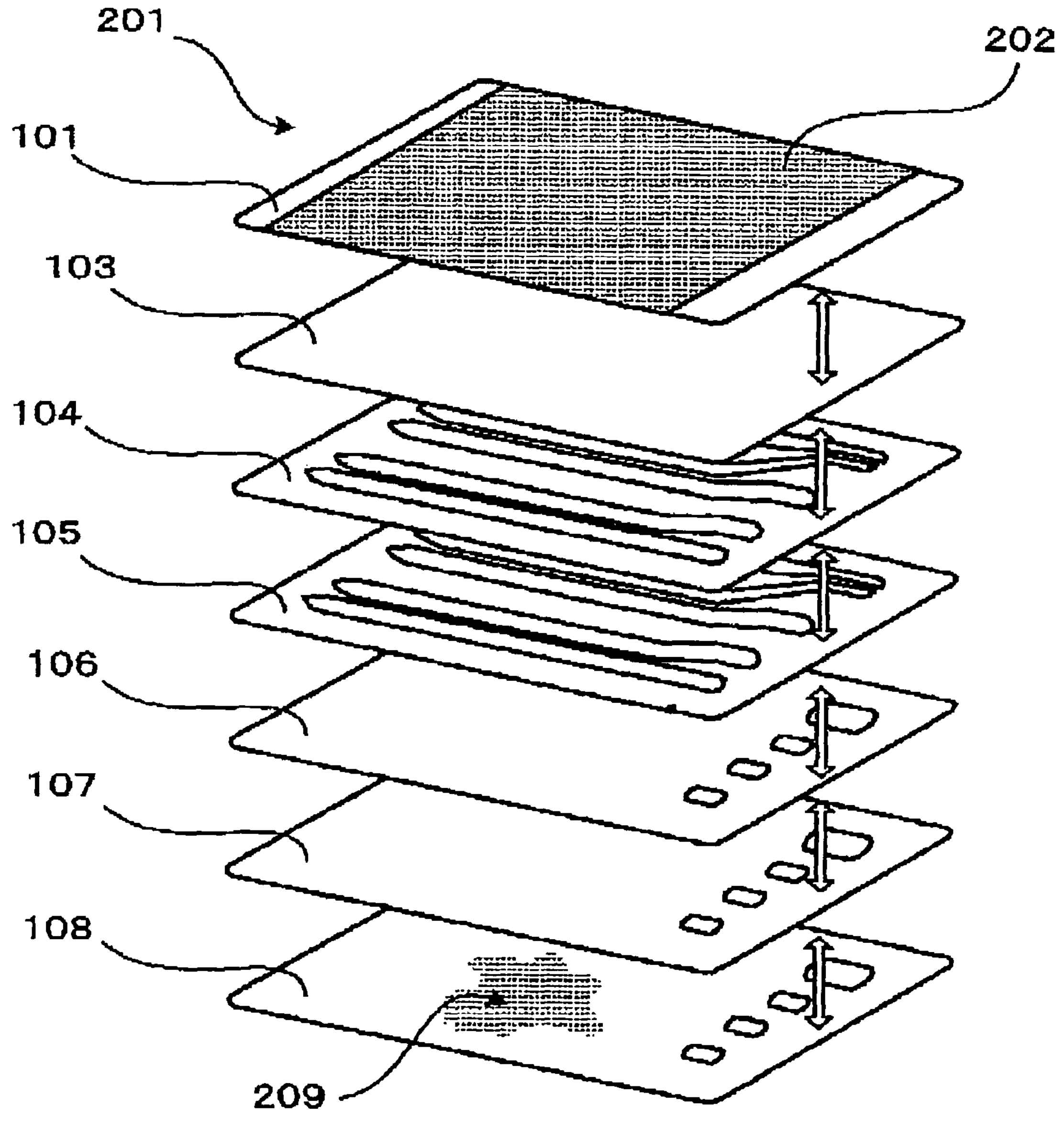
FIG. 13 is a perspective view showing a step of laminating the respective plates constituting a flow path unit shown in FIG. 7.

FIG. 13 is a view showing a step of laminating the flow path plates and the complex plate to each other (S6 of FIG. 7). In this step, the complex plate 201 through the measuring step of the nozzle 28 and the flow path plates 103 to 108 where the respective flow path holes are formed are laminated to each other. Those plates are laminated to each other, while their positions are adjusted such that in the order of the plates 201, 103, 104, 105, 106, 107 and 108, the flow path holes formed on the respective plates are linked, and the ink flow paths from the common ink rooms 99 to the nozzles 28 are formed (refer to FIG. 5).

At this time, thermosetting adhesives 209 (first adhesives) are coated in advance on the complex plate 201 and the respective flow path plates 103 to 108. In short, the complex plate 201 and the flow path plates 103 to 108 are laminated through the thermosetting adhesives 209 to each other. Thus, the lamination of the flow path unit 27 is completed. It is noted that the protective film 202 is still laminated to the surface of the side of the nozzle plate 101 in the complex plate 201.

<Heating>

Figure 14:
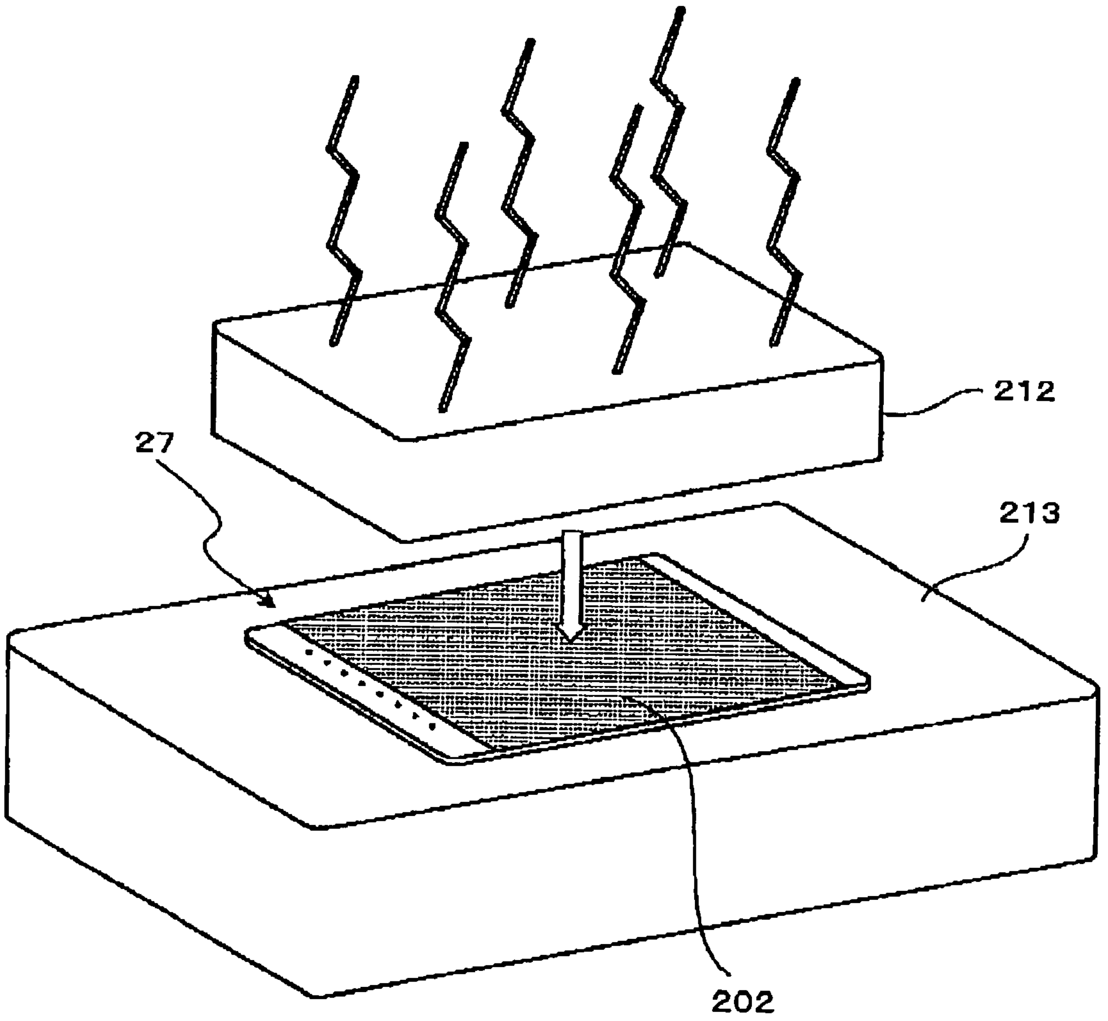
FIG. 14 is a perspective view showing a step of heating and curing an adhesive shown in FIG. 7.

FIG. 14 is a view showing a step of heating the flow path unit 27 where the lamination is completed in order to cure the thermosetting adhesive (S7 of FIG. 7). The flow path unit 27 in which the lamination is completed is placed on a heating table 213, and a heating unit 212 is pushed from above it. Thus, while the flow path unit 27 is compressed in the lamination direction, it is heated to the temperature that is equal to or higher than the curing temperature of the thermosetting adhesive and less than the heat-resistance temperature of the protective film 202.

Even in the heating step, the protective film 202 is still laminated to the surface (the nozzle surface 25*a*) where the nozzles are formed in the flow path unit 27. Thus, the procedure of removing the protective film and then heating the flow path unit 27 and again laminating the protective film is omitted. Also, as mentioned above, the protective film 202 has the heat resistance property equal to or higher than the curing temperature of the thermosetting adhesive, and the heating temperature is less than the heat resistance temperature of the protective film 202. Hence, the protective film 202 is never melted or deformed by the heating. In this way, since the thermosetting adhesive is heated and cured, the flow path unit 27 is completed.

It is noted that, if the area of the protective film 202 is narrower than the area on the surface of the flow path unit 27, at this heating step, the flow path unit 27 is not sufficiently compressed by the heating unit 212 and the heating table 213. In short, the flow path unit 27 is compressed through the protective film 202. Thus, if the area of the protective film 202 is made narrower, the compressed region is made narrower, which disables the whole of the flow path unit 27 to be uniformly compressed. Consequently, there is a fear where the adhesion defect is induced such that the thermosetting adhesive is not cured at the uniform thickness.

On the other hand, as mentioned above, the protective film 202 laminated to the PI sheet 203 covers the region other than the vicinity of the end where the dummy holes 102*a* are formed, on the surface of the PI sheet 203. The dummy holes 102*a* are formed on the place which is as close as possible to the end, in such a way that the maximal wide region of the PI sheet 203 is covered by the protective film 202. Thus, the wide region of the PI sheet 203 is covered by the protective film 202. Hence, when the flow path unit 27 is compressed at the heating step, the wide region on the flow path unit 27 is uniformly compressed. Hence, the foregoing adhesion defect is suppressed.

<Assembly of Head Unit>

Figure 15:
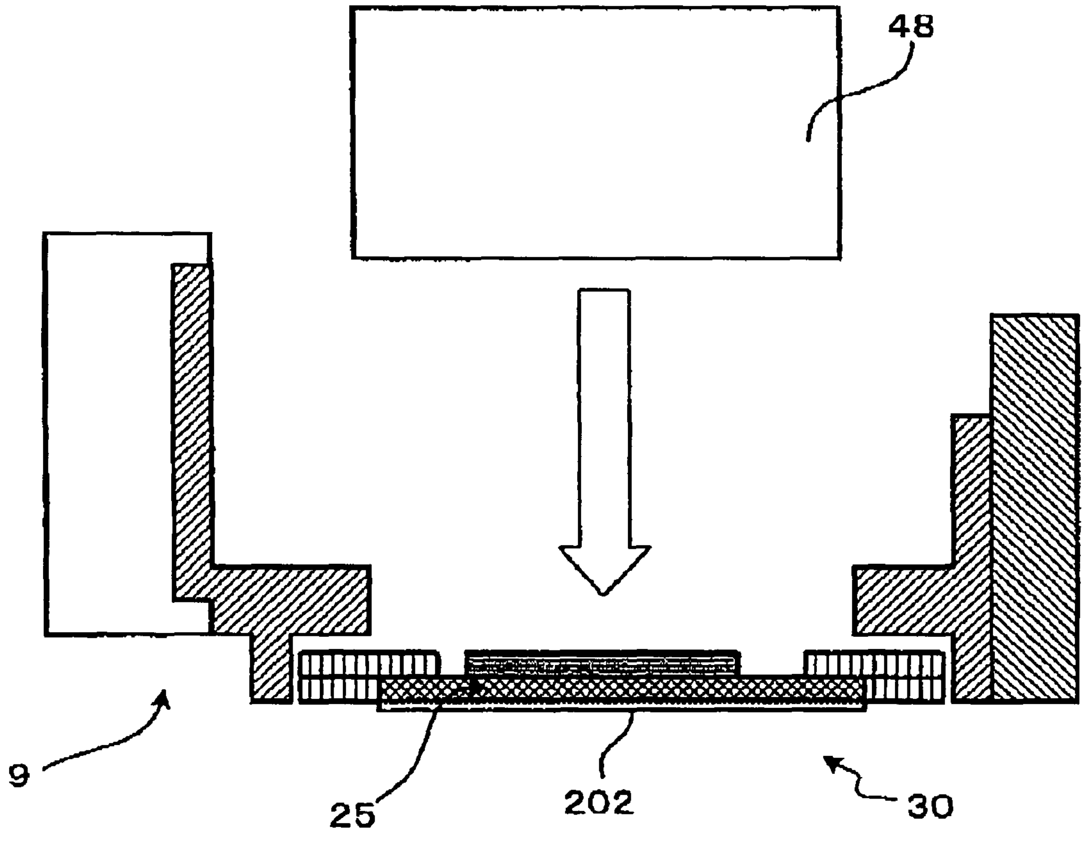
FIG. 15 is a lateral sectional view showing a step of assembling the head unit shown in FIG. 7.

FIG. 15 is a view showing a part of a step of assembling the head unit 8 (S8). The piezoelectric actuator 21 is laminated to the completed flow path unit 27 so that each of the individual electrodes 37 is arranged at the position corresponding to each pressure room 10. Thus, the head body 25 is completed. Moreover, the reinforcement frame 91 and the protective frame 92 are attached to the head body 25, and the ink jet head 30 is completed. Then, the piezoelectric actuator 21 and the FPC 70 are connected, and the ink jet head 30 is attached to the head holder 9. After that, as shown in FIG. 15, the buffer tank 48 is accommodated in the head holder 9, and the ink supply ports 91*a* to 91*d* of the ink jet head 30 and the ink flow outlets of the buffer tank 48 are connected respectively. In addition, the parts such as the heat sink 60 and the like and the cover 9*a* are attached to complete the head unit 8.

<Removal of Protective Film>

Figure 16:
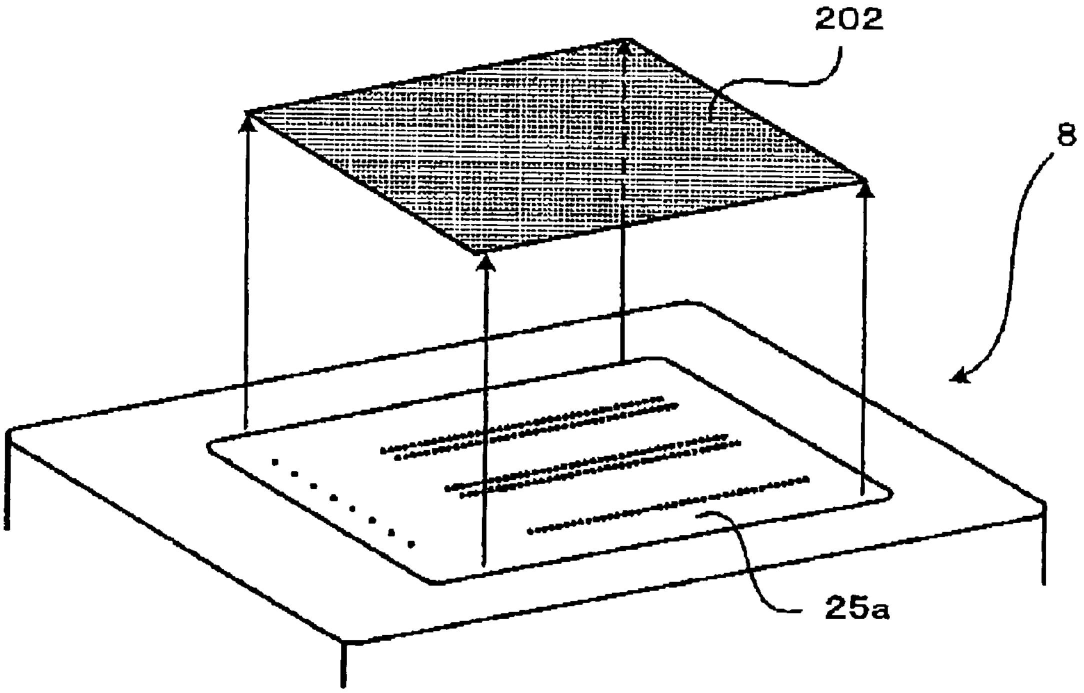
FIG. 16 is a perspective view showing a step of removing the protective film shown in FIG. 7.

FIG. 16 is a view showing a step of removing the protective film 202 from the head unit 8 which is completed. In this way, in this embodiment, after the completion of the head unit 8, the protective film 202 is removed from the nozzle surface 25*a*. Thus, at the respective steps until the completion of the head unit 8, the protective film 202 protects the nozzle surface 25*a* on the head body 25 and protects the dust and the like from being deposited around the nozzles 28 and protects the scar from being induced, at the manufacturing step of the head unit 8. Hence, it is avoided that such dusts and scars cause the drop in the discharging performance of the inks in the ink jet head 30.

<Another Embodiment According to Manufacturing Step>

Another embodiment according to the manufacturing method of the ink jet head will be described below. This embodiment has many configurations similar to the foregoing embodiment. Thus, hereafter, only the structures different from the foregoing embodiment is explained.

Figure 17:
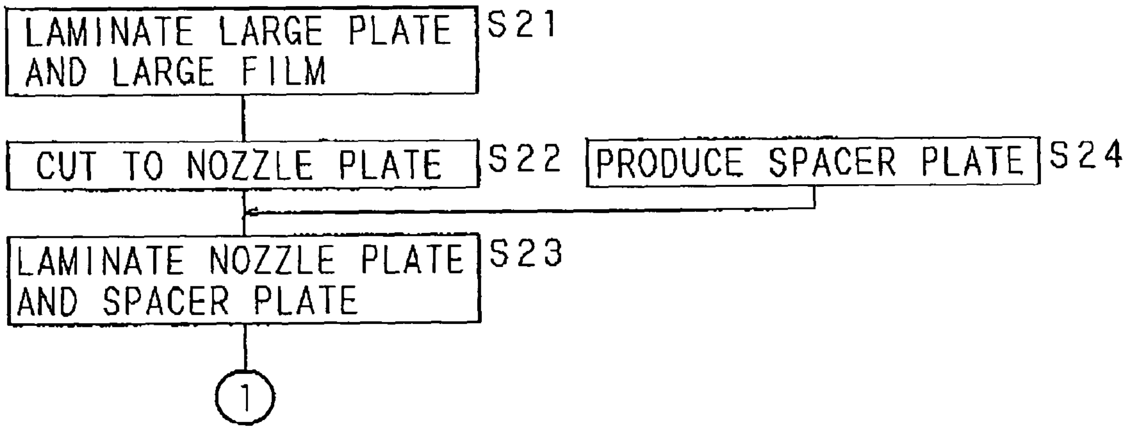
FIG. 17 is a flowchart showing a step according to another embodiment.

FIG. 17 is a flowchart showing the flow of the manufacturing step according to this embodiment. In this embodiment, at first, a large plate (third plate) to be a plurality of nozzle plates 101 and a large film (first film) to be a plurality of protective films 202 are laminated to each other (S21). After that, the laminated large plate and large film are cut to the outer shape of the nozzle plates 101 (S22) and laminated to the spacer plate 102 where the flow path holes and the like are formed (S24) (S23). The steps after that are similar to the steps after the S3 in FIG. 7.

Figure 18:
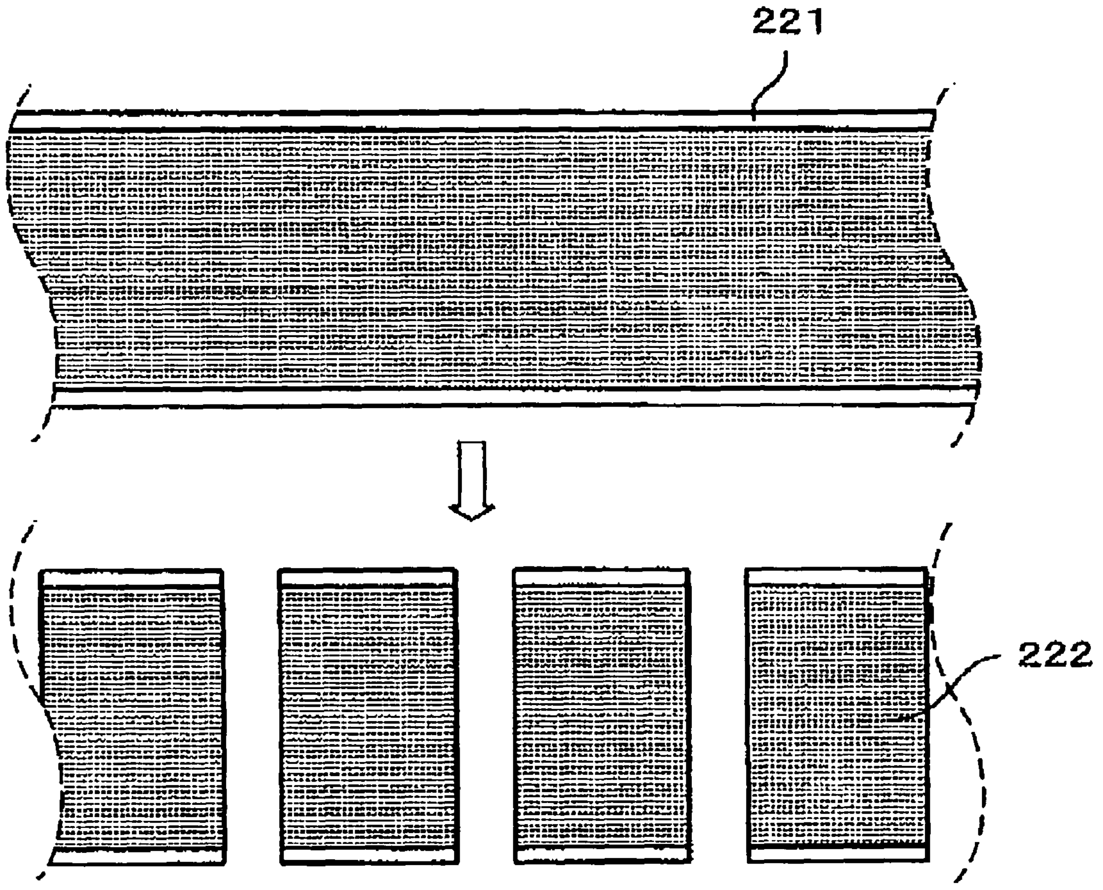
FIG. 18 is a top view showing a step of dividing a large plate and a large film, which are shown in FIG. 17, into an outer shape of a nozzle plate.

The respective steps will be described below. As shown in FIG. 18, a long PI sheet 221 corresponding to the plurality of nozzle plates 101 and a long film 222 corresponding to the plurality of protective films 202 are adjusted with regard to their positions and laminated to each other (S21 of FIG. 17). Then, the laminated PI sheet 221 and 222 are cut to the outer shape of the nozzle plates 101 (S22 of FIG. 17).

Figure 19:
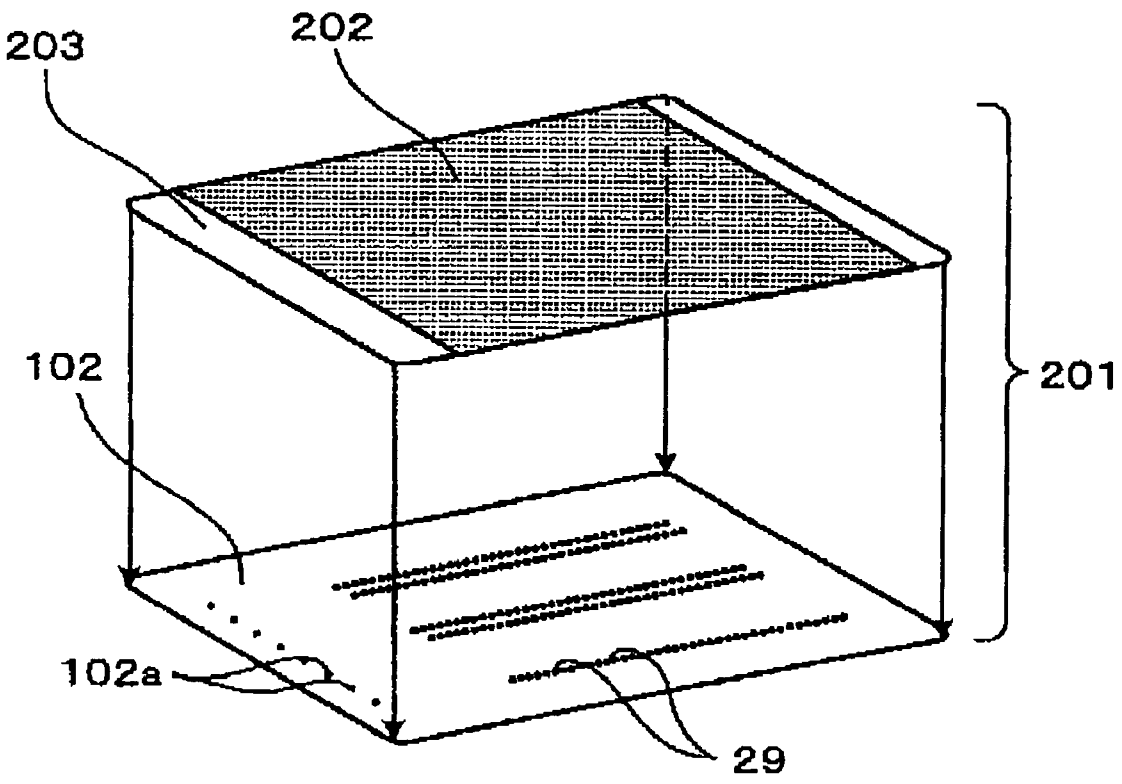
FIG. 19 is a perspective view showing a step of laminating a nozzle plate and a spacer plate, which are shown in FIG. 17.

Next, as shown in FIG. 19, the cut PI sheet 221 and film 222 (corresponding to the PI sheet 203 and the protective film 202 in the previous embodiment, respectively) are laminated to the spacer plate 102 where the penetration holes 29 and the dummy holes 102*a* are formed (S23 of FIG. 17). Consequently, the complex plate 201 is completed.

As described in this embodiment, after the PI sheet 221 and the film 222 are laminated to each other, they are cut to the outer shape of the nozzle plate 101. Thus, the number of the laminating steps is reduced as compared with the case of laminating the PI sheet 203 and the protective film 202, which are cut in advance to the outer shape of the nozzle plate 101, to each other.

<Variation>

As mentioned above, the preferable embodiments have been explained. However, this is not limited to the above-mentioned embodiments. The various modifications are possible within the range as noted in claims.

For example, in the above-mentioned embodiments, after the PI sheet 203 to be the nozzle plate is laminated to the spacer plate 102, the protective film 202 is laminated to the PI sheet 203. However, the nozzles 28 may be directly formed on the PI sheet 203 to which the protective film 202 is laminated without any laminating of the PI sheet 203 to the spacer plate 102. Also, the nozzles 28 may be formed by using a method except the laser irradiation. Other than the formation of the nozzles through the laser irradiation, the protective film 202 can be used to protect the nozzles 28. Moreover, after the two or more plates among the flow path plates 102 to 108 and the PI sheet 203 are laminated to each other, the nozzles 28 may be formed.

Also, after the PI sheet 203 to be the nozzle plate is laminated to the spacer plate 102 and then the protective film 202 is laminated to the PI sheet 203, when the nozzle 28 and the dummy nozzle hole 101*a* are formed, the formation of the dummy hole 102*a* is required in order to form the dummy nozzle hole 101*a* and measure its diameter and the like. However, when the dummy nozzle hole 101*a* is directly formed on the PI sheet 203 without any laminating to the spacer plate 102, the formation of the dummy hole 102*a* is not required.

Also, in the above-mentioned embodiments, the protective film 202 is removed from the head body 25 after the completion of the head unit 8. However, the protective film 202 may be removed at any time after the completion of the flow path unit 27 through the heating step. At this time, in the respective steps until the protective film 202 is removed from the head body 25 after the completion of the flow path unit 27, the nozzles 28 are protected from the dust and the scar. In particular, when the material having the high heat resistance property is used in the protective film 202, even at the step where the temperature of the nozzle plate 101 becomes high such as a soldering case and the like, the protective film may be still laminated.

Also, the above-mentioned embodiments use the lamination process, when the protective film 202 is laminated. However, the lamination process is not always required. For example, when the protective film 202 composed of only PET is laminated after the pressure sensitive adhesive serving as the adhesive is coated on the protective film 202, it may be laminated to the PI sheet 203.

In the above-mentioned embodiments, the printer that uses the piezoelectric actuator and discharges the inks is assumed. However, a printer that uses a different discharging method may be employed. For example, a printer may be employed for evaporating the inks within the pressure room and increasing the pressure and consequently discharging the inks.

According to this embodiment, after one or more flow path plates and the second plate are laminated to each other, the nozzle holes are formed. Thus, while the second plate is supported by the flow path plate, the nozzle holes can be formed. Consequently, the nozzle holes can be formed at the excellent precision.

According to this embodiment, at the heating step of the plates, the dissolution or deformation of the protective film is avoided. Thus, when they are heated after the formation of the nozzle holes, the protection of the nozzle holes is sufficiently reserved without any removal of the protective film until the completion of the heating step. Also, the protective film can be used in its original state at the steps after the heating step.

According to this embodiment, the precision of the nozzle holes can be measured while the nozzle holes are protected by the protective film.

According to this embodiment, even while all of the nozzle holes are protected by the protective film, the dummy nozzle holes can be used to measure the precision of the nozzle holes. Thus, at the time of the measurement, the protective film is not required to be removed, which omits the excessive steps.

According to this embodiment, the portion except the end of the nozzle plate can be widely covered by the protective film. Thus, when the plates are compressed through the protective film, the irregular compression of the plates can be avoided.

According to this embodiment, before the step of forming the nozzle holes on the second plate and after the step of forming the flow path holes on the first plates, the protective film can be laminated to the flow path plates and the second plate. Thus, the damage and deformation of the protective film can be avoided at the step prior to the formation of the nozzle holes.

According to this embodiment, the work is possible in the situation that the protective film is laminated to the second plate.

According to this embodiment, after the third plate and the first film are laminated to each other, it is divided into the size corresponding to the ink jet head. Thus, the numbers of the laminating and dividing steps are reduced as compared with the case of laminating the second plate and the protective film to each other after the second plate and the protective film are respectively divided.

According to this embodiment, the material having the sufficient heat resistance property that can endure the heating action of the heating step is used in the protective film.

According to this embodiment, the protective film is laminated to the nozzle plate through the adhesive having the adhesive property of the degree at which the protective film is easily removed. Thus, while the protective film surely protects the nozzle holes, it is easily removed at the step of removing the film.

According to this embodiment, the material that has the heat resistance property enduring the heating action of the heating step and has the adhesive property of the degree at which the protective film is easily removed is used in the adhesive.

As this description may be embodied in several forms without departing from the spirit of essential characteristics thereof, the present embodiment is therefore illustrative and not restrictive, since the scope is defined by the appended claims rather than by the description preceding them, and all changes that fill within metes and bounds of the claims, or equivalence of such metes and bounds thereof are therefore intended to be embraced by the claims.

What is claimed is:

1. A manufacturing method of an ink jet head that has: a plurality of laminated flow path plates in which a flow path hole is formed in each of them; and a nozzle plate laminated on said flow path plate located at the outermost position, wherein a nozzle hole which is linked to said flow path hole and discharges an ink supplied from said flow path hole is formed in said nozzle plate, comprising:

- a flow path hole forming step of forming said flow path holes on first plates to be said flow path plates, respectively;
- a first laminating step of laminating one flow path plate of said plurality of flow path plates on which said flow path hole is formed at said flow path hole forming step and a second plate to be said nozzle plate to each other;
- a second laminating step of laminating a protective film to said second plate;
- a third laminating step of laminating each of said plurality of flow path plates on which said flow path holes are formed at said flow path hole forming step to each other;
- a nozzle hole forming step of forming said nozzle hole on a region where the protective film is laminated, in said second plate to which the protective film is laminated at said second laminating step; and
- a film removing step of removing said protective film from said nozzle plate, after the first through third steps.

2. The manufacturing method of the ink jet head according to claim 1;

- wherein, after said first laminating step and said second laminating step, said nozzle hole forming step is executed.

3. The manufacturing method of the ink jet head according to claim 1;

- wherein at least one laminating step of said first laminating step and said third laminating step is executed by using a first adhesive having a thermosetting property;
- wherein a heat resistance temperature of said protective film is equal to or higher than a curing temperature of said first adhesive; and
- wherein said manufacturing method further comprises a heating step of heating said protective film, said plurality of flow path plates, and said nozzle plate, which are laminated to each other, to the temperature that is equal to or higher than the curing temperature of said first adhesive and less than the heat resistance temperature of said protective film.

4. The manufacturing method of the ink jet head according to claim 3, further comprising:

- a nozzle hole inspecting step of inspecting said nozzle hole formed by said nozzle hole forming step prior to said film removing step.

5. The manufacturing method of the ink jet head according to claim 4;

- wherein said nozzle hole forming step includes a dummy nozzle hole forming step of forming a dummy nozzle hole on a region where the protective film is not laminated, in said second plate to which the protective film is laminated, at said second laminating step, and in said nozzle hole inspecting step, said dummy nozzle hole is measured.

6. The manufacturing method of the ink jet head according to claim 5;

- wherein in said dummy nozzle hole forming step, said dummy nozzle hole is formed on a vicinity of an end of said second plate; and
- wherein, in said heating step, while said protective film, said plurality of flow path plates, and said nozzle plate are compressed in a direction where said protective film and said plates are laminated, said protective film, said plurality of flow path plates, and said nozzle plate are heated to the temperature that is equal to or higher than the curing temperature of said first adhesive and less than the heat resistance temperature of said protective film.

7. The manufacturing method of the ink jet head according to claim 1, further comprising:

- a nozzle hole inspecting step of inspecting said nozzle hole formed by said nozzle hole forming step prior to said film removing step.

8. The manufacturing method of the ink jet head according to claim 7;

- wherein said nozzle hole forming step includes a dummy nozzle hole forming step of forming a dummy nozzle hole on a region where said protective film is not laminated, in said second plate to which said protective film is laminated, at said second laminating step, and in said nozzle hole inspecting step, said dummy nozzle hole is measured.

9. The manufacturing method of the ink jet head according to claim 1;

- wherein after said first laminating step, said second laminating step is executed.

10. The manufacturing method of the ink jet head according to claim 1;

wherein after said second laminating step, said first laminating step is executed.

11. The manufacturing method of the ink jet head according to claim 10;

wherein said second laminating step includes:

a fourth laminating step of laminating a third plate to be said plurality of second plates and a first film to be the plurality of protective films to each other; and a dividing step of dividing said third plate and said first film, which are laminated at said fourth laminating step, into sizes of said nozzle plate.

12. The manufacturing method of the ink jet head according to claim 1;

wherein said protective film has a base film made of any of polyimide resin and polyethylene terephthalate resin.

13. The manufacturing method of the ink jet head according to claim 12;

wherein said protective film includes a second adhesive having an adhesion property of a degree at which the protective film is easily removed at said film removing step; and wherein, in said second laminating step, the protective film is laminated to said nozzle plate so that said second adhesive is sandwiched between said base film and said nozzle plate.

14. The manufacturing method of the ink jet head according to claim 13;

wherein said second adhesive is any of an acryl group and a silicon group.

* * * * *